(12) United States Patent
Joo et al.

(10) Patent No.: US 11,327,095 B2
(45) Date of Patent: May 10, 2022

(54) PROBE CARDS, SYSTEM FOR MANUFACTURING SEMICONDUCTOR DEVICE, AND METHOD OF MANUFACTURING SEMICONDUCTOR DEVICE

(71) Applicant: Samsung Electronics Co., Ltd., Suwon-si (KR)

(72) Inventors: Sungho Joo, Hwaseong-si (KR); Gyeongwon Park, Uijeongbu-si (KR); Gyuyeol Kim, Hwaseong-si (KR); Ikbum Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 16/886,430

(22) Filed: May 28, 2020

(65) Prior Publication Data

US 2021/0055328 A1  Feb. 25, 2021

(30) Foreign Application Priority Data

Aug. 19, 2019 (KR) .................. 10-2019-0101134
Nov. 7, 2019 (KR) .................. 10-2019-0141897

(51) Int. Cl.
*G01R 1/073* (2006.01)
*G01R 1/067* (2006.01)
*G01R 27/20* (2006.01)
*G01R 31/319* (2006.01)

(52) U.S. Cl.
CPC ..... *G01R 1/07342* (2013.01); *G01R 1/06794* (2013.01); *G01R 27/205* (2013.01); *G01R 31/31905* (2013.01)

(58) Field of Classification Search
CPC ........... G01R 1/07342; G01R 1/06794; G01R 27/205; G01R 31/31905; G01R 31/2886
See application file for complete search history.

(56) References Cited

U.S. PATENT DOCUMENTS

| | | | |
|---|---|---|---|
| 6,878,964 | B1 | 4/2005 | Lien et al. |
| 7,498,824 | B2 | 3/2009 | Lane |
| 7,622,940 | B2 | 11/2009 | Kim et al. |
| 8,963,569 | B2 | 2/2015 | Chang et al. |

(Continued)

FOREIGN PATENT DOCUMENTS

| | | |
|---|---|---|
| JP | 2003-279624 A | 10/2003 |
| JP | 2018-112546 A | 7/2018 |
| KR | 10-1998-0012197 U | 5/1998 |

*Primary Examiner* — Akm Zakaria
(74) *Attorney, Agent, or Firm* — Harness, Dickey & Pierce, P.L.C.

(57) ABSTRACT

A probe card, a system for manufacturing a semiconductor device, and a method of manufacturing a semiconductor device are provided. A probe card includes a first probe configured to contact a first ground pad of a device under test, a reference resistor including a first terminal and a second terminal and connected to the first probe, and a second probe configured to contact a second ground pad of the device under test, wherein the second probe is further configured to be connected to a ground node for applying a reference potential, and the first terminal of the reference resistor is configured to be connected to the first probe and the second terminal of the reference resistor is configured to receive an input potential.

20 Claims, 16 Drawing Sheets

(56) References Cited

U.S. PATENT DOCUMENTS

| | | | |
|---|---|---|---|
| 2002/0132382 A1* | 9/2002 | Hebert | G01R 1/07385 438/17 |
| 2005/0237073 A1* | 10/2005 | Miller | G01R 1/07385 324/756.03 |
| 2009/0267627 A1* | 10/2009 | Miller | G01R 31/2889 324/750.01 |
| 2013/0113511 A1* | 5/2013 | Goeke | G01R 1/00 324/755.01 |
| 2017/0146632 A1* | 5/2017 | Wadell | G01R 35/005 |

* cited by examiner

PROBE CARDS, SYSTEM FOR MANUFACTURING SEMICONDUCTOR DEVICE, AND METHOD OF MANUFACTURING SEMICONDUCTOR DEVICE

CROSS-REFERENCE TO RELATED APPLICATIONS

This application claims the benefit of Korean Patent Applications No. 10-2019-0101134 and No. 10-2019-0141897, respectively filed on Aug. 19, 2019 and Nov. 7, 2019, in the Korean Intellectual Property Office, the disclosures of which are incorporated herein in their entirety by reference.

BACKGROUND

The inventive concepts relate to a probe card, a system for manufacturing a semiconductor device, and/or a method of manufacturing a semiconductor device.

After a plurality of semiconductor devices are formed on a wafer through a manufacturing process of the semiconductor devices, an electrical characteristics test is performed on each of the semiconductor devices. The electrical characteristics test may be performed by applying an electrical signal to the semiconductor devices on the wafer and reading a signal that is output in correspondence to the applied electrical signal. Here, the application and the reading of the electrical signal may be performed by a probe card including a plurality of probes. The plurality of probes are configured to contact pads on the semiconductor devices, the pads being formed for a test of the semiconductor devices.

SUMMARY

The inventive concepts provides a probe card, a system for manufacturing a semiconductor device, and/or a method of manufacturing a semiconductor device, whereby reliability is improved.

In one embodiment, the probe card includes a reference resistor comprising a first terminal and a second terminal, the second terminal configured to receive an input potential; a first probe connected to the first terminal of the reference resistor, the first probe configured to contact a first ground pad of a device under test, a ground node configured to apply a reference potential, and a second probe connected to the ground node, the second probe configured to contact a second ground pad of the device under test, wherein the second probe is further configured to be connected to a ground node for applying a reference potential, and the first terminal of the reference resistor is configured to be connected to the first probe and the second terminal of the reference resistor is configured to receive an input potential.

In one embodiment, the system includes a probe card including a first probe configured to receive an input potential and contact a first ground pad of a device under test, a second probe configured to contact a second ground pad of the device under test, a third probe configured to contact a power pad, to which operating power of the device under test is supplied, a fourth probe configured contact an alternating current (AC) pad configured to perform an AC test on the device under test, a fifth probe configured to contact a data pad of the device under test, and a sixth probe configured to contact a direct current (DC) pad and measure a potential level of a set location of the device under test, a tester head including a ground node, the ground node configured to provide a reference potential, the reference potential being different from the input potential, and the ground node connected to the second probe; and a tester server configured to generate a test signal and transmit the test signal to the tester head.

In one embodiment, the system includes a probe card including a first probe configured to contact a first ground pad of a device under test, a reference resistor including a first terminal and a second terminal opposite to the first terminal, the reference resistor connected to the first probe by the first terminal of the reference resistor, the second terminal configured to receive an input potential, and a second probe configured receive a reference potential, the reference potential being different from the input potential, and the second probe configured to contact a second ground pad of the device under test, a tester head configured to control the probe card, and a tester server configured to transmit a test signal to the tester head.

In one embodiment, the method includes determining a contact resistance of a first probe by connecting the first probe and a second probe to ground pads of a device under test, applying a reference potential to the second probe and applying an input potential to the first probe, the input potential being different from the reference potential, performing an electronic die sorting (EDS) test on the device under test, when the contact resistance of the first probe is less than a threshold value, and packaging the device under test, when a result of the EDS test indicates the device under test operates normally.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
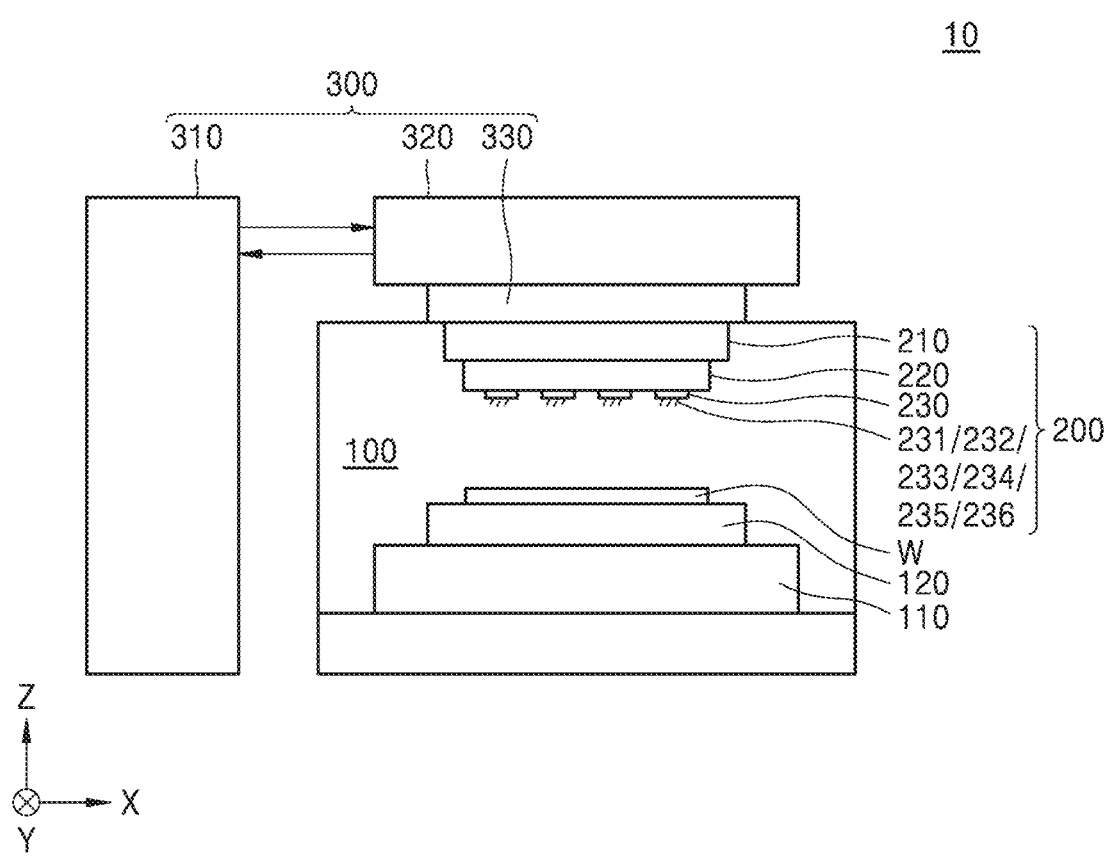
FIG. 1 is a schematic diagram of a system for manufacturing a semiconductor device, according to some example embodiments.

Hereinafter, embodiments of the inventive concepts are described in detail with reference to the accompanying drawings. Like elements in the drawings are referred to by using like reference numerals, and repeated descriptions thereof are not given. When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a schematic diagram for describing a system 10 for manufacturing a semiconductor device, according to one or more embodiments.

Referring to FIG. 1, the system 10 for manufacturing the semiconductor device may include a test chamber 100, a probe card 200, and a test apparatus 300.

A chuck operating device 110, a chuck 120, and a substrate W may be arranged in the test chamber 100. The substrate W may be arranged over the chuck 120. Here, the substrate W may include a semiconductor wafer on which a plurality of devices under test DUT1 and DUT2 (refer to FIG. 2) are formed.

According to one or more embodiments, the substrate W may be arranged on the chuck 120 such that pads DQ, AC, DC, P, G1, and G2 of the devices under test DUT1 and DUT2 (refer to FIG. 2) are toward the probe card 200.

The system 10 for manufacturing the semiconductor device may test electrical characteristics of devices under test in the test chamber 100. According to one or more embodiments, an electric die sorting (EDS) process may be performed in the test chamber 100. According to one or more embodiments, probes 231 through 236 of the probe card 200 may be tested in the test chamber 100.

Here, the EDS process refers to a process in which electrical signals are applied to semiconductor devices formed on the substrate W, signals that are output from the semiconductor devices in correspondence to the applied electrical signals are read, and then, it is determined based on the read signals whether or not the semiconductor devices are defective. For example, according to one or more embodiments, probes 231 through 236 of the probe card 200 may supply the electrical signals to the semiconductor devices on the substrate W.

According to one or more embodiments, in order to test the electrical characteristics of the devices under test, the system 10 for manufacturing the semiconductor device may perform at least one of a direct current (DC) test and an alternating current (AC) test on the substrate W. Here, the DC test refers to a test in which a predetermined potential is applied to an input pad of the substrate W and DC characteristics, such as open/short, input currents, output potentials, power currents, etc., are measured to determine whether the devices under test are defective. The AC test refers to a test in which a pulse signal is applied to the input pad of the substrate W and operational characteristics, such as a delay time of input and output transmission, a start/end time of an output signal, etc., are measured to determine whether the devices under test are defective.

According to one or more embodiments, in order to test whether the probe card 200 is defective, the system 10 for manufacturing the semiconductor device may apply a set input signal (for example, current or voltage) to a conductive pattern (not shown) of the substrate W by using one of the probes 231 through 236 and may detect a transmitted output signal (for example, currents and/or voltages) by using another one of the probes 231 through 236. The conductive pattern may be, for example, referenced with a known or expected output signal.

The chuck 120 may be arranged over the chuck operating device 110. The chuck 120 may fix the substrate W via electrostatic adsorption, vacuum adsorption, etc. Sandpaper having a desired (or, alternatively predetermined) roughness may further be arranged at a side surface of the chuck 120. When the probes 231 through 236 are contaminated by impurities, etc., the probes 231 through 236, which were contaminated, may be sanded with the sandpaper to remove the impurities, etc. Accordingly, the probes 231 through 236 may maintain good contact resistances (for example, decreased contact resistances). This process is called probe polishing.

The chuck operating device 110 may be arranged below the chuck 120 and connected to the chuck 120. The chuck operating device 110 may perform translation movement of the chuck 120 in first through third directions (X, Y, and Z directions). In addition, the chuck operating device 110 may rotate the chuck 120. Here, the first and second directions (the X and Y directions) refer to the two directions parallel to an upper surface of the substrate W and are substantially perpendicular to each other, and the third direction (the Z direction) refers to a direction substantially perpendicular to the upper surface of the substrate W. Unless it is particularly mentioned, definitions of the directions are the same for all the drawings described hereinafter. For example, even when only a portion of the system 10 for manufacturing the semiconductor device is illustrated, the definitions of the first through third directions (the X, Y, and Z directions) based on the upper surface of the substrate W are the same. Accordingly, the substrate W fixed on the chuck 120 may rotate in the horizontal directions (the X and Y directions) and/or move linearly in the horizontal and vertical directions (the X, Y, and Z directions).

According to one or more embodiments, the chuck operating device 110 may rotate the chuck 120 such that an alignment direction of the pads DQ, AC, DC, P, G1, and G2 (refer to FIG. 2) of the devices under test DUT1 and DUT2 (refer to FIG. 2) formed on the substrate W is parallel with an alignment direction of the probes 231 through 236. According to one or more embodiments, the chuck operating device 110 may move the chuck 120 in the first and second directions (the X and Y directions) such that the pads DQ, AC, DC, P, G1, and G2 (refer to FIG. 2) of the devices under test DUT1 and DUT2 (refer to FIG. 2) formed on the substrate W are perpendicularly aligned with respect to the probes 231 through 236. According to one or more embodiments, the chuck operating device 110 may move the chuck 120 in the third direction (the Z direction) such that the pads DQ, AC, DC, P, G1, and G2 (refer to FIG. 2) of the devices under test DUT1 and DUT2 (refer to FIG. 2) formed on the substrate W are electrically and/or physically connected to the probes 231 through 236.

According to one or more embodiments, the probe card 200 may include a printed circuit board 210, a tile fixing substrate 220, and a plurality of ceramic tiles 230. According to one or more embodiments, the plurality of ceramic tiles 230 may include the plurality of probes 231 through 236 protruding in the third direction (the Z direction). According to one or more embodiments, each of the plurality of ceramic tiles 230 may correspond to one device under test DUT1 or DUT2 (see FIG. 2). However, the inventive concepts are not limited thereto, and the plurality of ceramic tiles 230 may correspond to any one of the devices under test DUT1 and DUT2 (see FIG. 2) or the plurality of devices under test DUT1 and DUT2 (see FIG. 2) may correspond to any one of the ceramic tiles 230.

According to one or more embodiments, the test apparatus 300 may include a tester server 310, a tester head 320, and a base 330. The base 330 may be connected to the probe card 200. According to one or more embodiments, the base 330 may be connected to the printed circuit board 210 of the probe card 200.

According to one or more embodiments, the tester head 320 may be electrically connected to the probe card 200 through the base 330. The tester head 320 may also be electrically connected to the tester server 310 and may transmit electrical signals between the tester server 310 and the probe card 200. However, it is not limited thereto, and the tester server 310 may directly transmit and receive the electrical signals to and from the probe card 200.

The tester server 310 may output an electrical signal for a test and read an electrical signal corresponding to a result of the test. According to one or more embodiments, the tester server 310 may determine whether the devices under test DUT1 and DUT2 (see FIG. 2) formed on the substrate W operate normally. According to one or more embodiments, the tester server 310 may determine whether the probe card 200 operates normally.

For example, the tester server 310 may output an electrical signal for testing the electrical characteristics of the devices under test DUT1 and DUT2 (see FIG. 2) formed on the substrate W. According to one or more embodiments, the electrical signal output by the tester server 310 may be applied to the devices under test DUT1 and DUT2 (see FIG. 2) formed on the substrate W through the tester head 320 and/or the probe card 200. The devices under test DUT1 and DUT2 (see FIG. 2) may perform an operation according to the applied electrical signal and may output an electrical signal corresponding to a result of the test through any one of the pads DQ, AC, DC, P, G1, and G2 (see FIG. 2). The result of the test that is output by any one of the pads DQ, AC, DC, P, G1, and G2 (see FIG. 2) may be transmitted to the tester server 310 through the probe card 200 and the tester head 320. Accordingly, the test apparatus 300 may determine whether the devices under test DUT1 and DUT2 (see FIG. 2) formed on the substrate W are normal or defective.

FIGS. 2 through 5B are schematic diagrams for describing a system for manufacturing a semiconductor device, according to some example embodiments.

Figure 2:
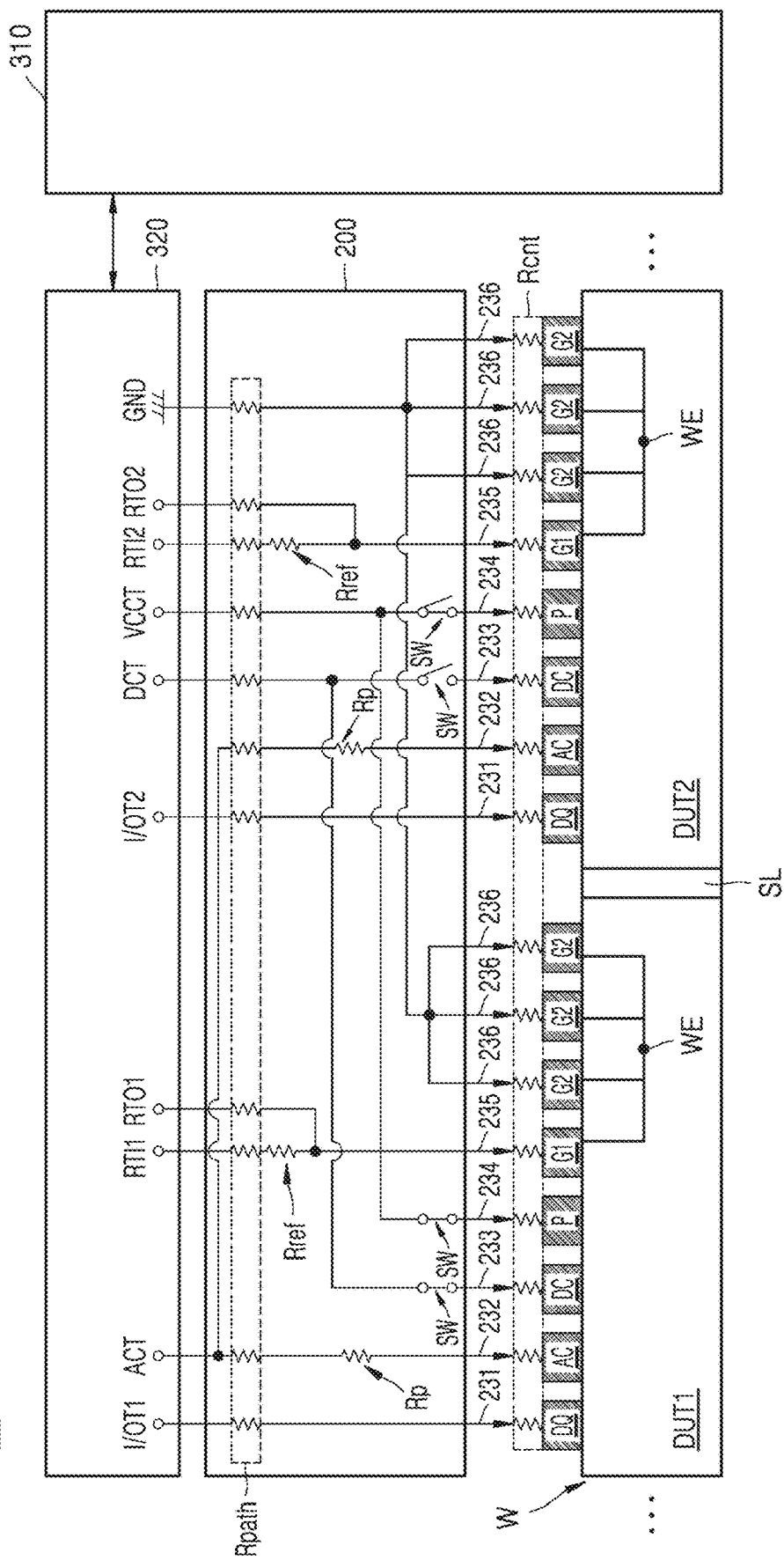
FIGS. 2 through 4B are schematic diagrams for describing a system for manufacturing a semiconductor device, according to some example embodiments.

Referring to FIG. 2, the substrate W may include the plurality of devices under test DUT1 and DUT2. The substrate W may include a scribe lane SL, which is a reference line for separating the devices under test DUT1 and DUT2, in a following individualization process.

The devices under test DUT1 and DUT2 may include, for example, semiconductor devices. Here, the semiconductor devices may include memory devices, non-memory devices, or a combination thereof. According to one or more embodiments, the memory devices may be non-volatile NAND-type flash memories. According to one or more embodiments, the devices under test DUT1 and DUT2 may include phase-change random-access memory (PRAM), magnetic random-access memory (MRAM), resistance random-access memory (ReRAM), ferroelectric random-access memory (FRAM), NOR flash memory, etc. In addition, the devices under test DUT1 and DUT2 may include volatile memory devices which lose data when power is blocked, such as dynamic random-access memory (DRAM) and static random-access memory (SRAM). According to one or more embodiments, the devices under test DUT1 and DUT2 may include logic chips, measuring devices, communication devices, digital signal processors (DSPs), system-on-chips (SOCs), or the like.

The devices under test DUT1 and DUT2 may include the plurality of pads DQ, AC, DC, P, G1, and G2. The plurality of pads DQ, AC, DC, P, G1, and G2 may include, for example, ground pads G1 and G2, power pads P, alternating current (AC) pads AC, data pads DQ, and/or direct current (DC) pads DC. The ground pads G1 and G2 may include first ground pads G1 corresponding to contact resistance test probes 235 described below and second ground pads G2 corresponding to ground probes 236 described below.

The ground pads G1 and G2 may be pads for providing a reference potential for circuit operations of the devices under test DUT1 and DUT2. The power pads P may be pads for supplying power for circuit operations. The AC pads AC may be pads for supplying AC power to the devices under test DUT1 and DUT2 or receiving a signal for performing the AC test described above. The DC pads DC may be pads for measuring a potential level at a specific location of the devices under test DUT1 and DUT2. For example, the DC pads DC may be pads for testing whether a set potential value is applied in a set location in the devices under test DUT1 and DUT2, when a driving potential is applied to the devices under test DUT1 and DUT2. The data pads DQ may be pads for inputting/outputting logic signals or data.

As described above, different pads may be provided according to a type of the devices under test DUT1 and DUT2. The probe card 200 may include the plurality of probes 231 through 236 corresponding to the plurality of pads formed on the devices under test DUT1 and DUT2, in order to test the devices under test DUT1 and DUT2. The plurality of probes 231 through 236 may include probes that correspond to the different pads. For example, the plurality of probes 231 through 236 may include input/output (I/O) probes 231, AC probes 232, DC probes 233, VCC probes 234, contact resistance test probes 235, and ground probes 236.

The tester head 320 may include a plurality of nodes for generating and/or reading an electrical signal (for example, voltages and/or currents) for a test. The plurality of nodes may include a DC test node DCT, I/O test nodes I/OT1 and I/OT2, an AC test node ACT, resistance test input nodes RT11 and RT12, resistance test output nodes RTO1 and RTO2, and a ground node GND. The plurality of nodes may be connected to the plurality of probes 231 through 236 through a plurality of signal lines. Some of the signal lines may be connected to the plurality of probes 232 through 234 in the probe card 200, for improvement of a test speed. For convenience, FIG. 2 illustrates that the plurality of nodes, through the signal lines, are each connected to two probes 232, 233, and 234. However, the embodiments are not so limited thereto; for example, the plurality of nodes may each be connected to three or more probes. Accordingly, it is illustrated in FIG. 2 as a non-limiting example that the signal lines for transmitting test signals of the DC test node DCT, the I/O test nodes I/OT1 and I/OT2, and the AC test node ACT are divided into two. However, the inventive concept is not limited thereto.

A path resistance Rpath may be formed in the signal lines. The path resistance Rpath refers to a total resistance generated from each of the DC test node DCT, the I/O test nodes I/OT1 and I/OT2, the AC test node ACT, the resistance test input nodes RTI1 and RTI2, the resistance test output nodes RTO1 and RTO2, and the ground node GND to the corresponding probes 231 through 236. The path resistance Rpath may have a value that is pre-known with high accuracy and/or negligible. Thus, the path resistance Rpath denotes a resistance of a resistors parasitically generated in an electrical path from the tester head 320 to the devices under test DUT1 and DUT2, rather than being generated from an additional device.

The I/O probes 231 may be probes for testing the DQ pads DQ. The I/O probes 231 may be configured to contact the DQ pads DQ. The AC probes 232 may be probes for testing the AC pads AC. The AC probes 232 may be configured to contact the AC pads AC. The DC probes 233 may be probes for testing the DC pads DC. The DC probes 233 may be configured to contact the DC pads DC. The VCC probes 234 may be probes for testing the power pads P. The VCC probes 234 may be configured to contact the power pads P. Each of the contact resistance test probes 235 may be configured to contact the first ground pads G1. The contact resistance test probes 235 may test contact resistances Rcnt. The ground probes 236 may be probes for testing the second ground pads G2. The ground probes 236 may be configured to contact the second ground pads G2.

FIG. 2 illustrates that the I/O probes 231 are not connected to a switch device SW and each of the I/O probes 231 is connected to a different I/O test node I/OT1 or I/OT2; that the AC probes 232 are connected to a protection resistor Rp and to an AC test ACT, and are not connected to the switch device SW; that the DC probes 233 are not connected to the protection resistor Rp, are connected to switch devices SW, respectively, and are connected to a DC test node DCT through the switch devices SW; and that the VCC probes 234 are not connected to the protection resistor Rp, are connected to the switch devices SW, respectively, and are connected to a VCC test node VCCT through the switch devices SW. However, this is an example and the inventive concepts are not limited thereto. Structures and connection methods of the probes may vary according to methods of circuit operations of the devices under test DUT1 and DUT2 and functions of the plurality of pads DQ, AC, DC, P, G1, and G2.

For example, some of the AC probes may be connected to switch devices SW and the others may not be connected to the switch devices SW. As another example, some of the DQ probes may be connected to a separate node, but the others may be integrally connected to the same node.

Here, the protection resistors Rp may prevent damage to the other device under test, when a short-circuit defect occurs to any one of the devices under test while the devices under test DUT1 and DUT2 are tested in parallel, and may have a resistance value that is greater than a resistance of reference resistor Rref, for example, about 100Ω through about 300Ω.

A contact resistances Rcnt may be formed with the plurality of probes 231 through 236 contacting the pads DQ, AC, DC, P, G1, and G2. The arrangement of the contact resistances Rcnt of FIG. 2 is conceptual and the probes 231 through 236 may, for example, directly contact the pads DQ, AC, DC, P, G1, and G2. Values of the contact resistances Rcnt may be dependent on the degree of use (the number of usages and the method of usage after polishing the probes) of the probes 231 through 236. In more detail, when a test of the substrate W is performed by using the probe card 200, debris (for example, aluminum debris) of the pads may be attached to the plurality of probes 231 through 236. The debris may be, for example, oxidized and increase the contact resistances of the probes 231 through 236. When the contact resistance Rcnt is increased, there may be a danger of determining a device under test DUT1 or DUT2, which is operating normally, to be defective. Thus, to prevent the false negative, a probe polishing process for polishing the probes 231 through 236 may be performed according to a desired (or, alternatively predetermined) cycle.

According to one or more embodiments, the tester head 320 may apply a reference potential to the second ground pads G2 and a well WE formed in the devices under test DUT, through the ground probes 236 of the probe card 200. Here, the plurality of contact resistances Rcnt between the second ground pads G2 and the ground probes 236 are connected in parallel, and thus, equivalents of the contact resistances Rcnt may have a very small value. For example, when the contact resistances Rcnt corresponding to each of the three second ground pads G2 are about 3Ω, as illustrated in FIG. 2, an equivalent contact resistance Rcnt between the well WE and the ground probes 236 may be about 1Ω, which is negligible. The structures of the probe cards and the devices under test of FIG. 2 are illustrated for convenience of explanation. However, a plurality of ground probes, for example 8 or more, may be connected in parallel, and thus, the contact resistances of the ground probes may be substantially negligible.

The well WE may be an area doped with P-type dopants or N-type dopants. In one or more embodiments, the doped areas have a high concentration of the dopants. The ground pads G1 and G2 may be electrically short-circuited with the well WE. When the ground pads G1 and G2 and the well WE are electrically short-circuited a substantial potential difference may be not generated between the ground pads G1 and G2 and the well WE while currents are applied (for example, while the devices under test DUT1 and DUT2 are tested by using the probe card 200, etc., or the devices under test DUT1 and DUT2 are in operation).

Signals (for example, voltage potentials and/or current rates) for measuring a contact resistance may be applied through the resistance test input nodes RTI1 and RTI2. According to one or more embodiments, the signals for measuring the contact resistance may be an input potential Vin. In this case, a measuring potential Vmeas, which is read through the resistance test output nodes RTO1 and RTO2, and the input potential Vin may satisfy the following Equation 1.

$$Vmeas = \frac{Rcnt}{Rref + Rpath + Rcnt} Vin \quad \text{[Equation 1]}$$

The contact resistance Rcnt may be determined according to the following Equation 2.

$$Rcnt = \frac{Vmeas}{Vin - Vmeas}(Rref + Rpath) \approx \frac{Vmeas}{Vin - Vmeas}(Rref) \quad \text{[Equation 2]}$$

The input potential Vin may be less than a threshold value of an operating potential of the devices under test DUT1 and DUT2, for example a maximum operating potential of the devices under test DUT1 and DUT2. According to one or more embodiments, the threshold value of the operating potential may be determined from a database with respect to time zero dielectric breakdown (TZDB), but it is not limited thereto. According to one or more embodiments, an absolute value of the input potential Vin may be greater than 0V and/or 5V or less volts, for example the absolute value of the input potential Vin may be between 0V and 5V. According to one or more embodiments, the input potential Vin may be a negative potential or a positive potential. When the input potential Vin is a negative potential the input potential Vin is relatively lower than a potential of the ground terminal GND of the probe card 200. When the input potential Vin is a positive potential the input potential Vin is relatively higher than the potential of the ground terminal GND of the probe card 200. According to another one or more embodiment, the input potential Vin may be determined from a potential voltage capacity and/or a power capacity of the reference resistor Rref. According to one or more embodiments, the reference resistor Rref may include a chip resistance. The reference resistor Rref may have, for example, a resistance value of about 10Ω to about 50Ω.

For example, the path resistance Rpath may have a less resistance value (for example, a resistance value equal to or less than about 3Ω) than the resistance of the reference resistor Rref. Thus, an approximate formula of Equation 2 may be formed. However, it is not limited thereto and the contact resistance Rcnt may be calculated by using the path resistance Rpath, which is accurately known (or measured).

When the contact resistance is increased due to debris accumulation and oxidization on the probes 231 through 236, the increase of the contact resistance may affect the results of an EDS test and the reliability of the EDS test may deteriorate. A probe contact resistance may be reduced by a probe polishing process for removing the debris. However, when probe polishing processes are repeated, the probes 231 through 236 may be worn out and may have a reduced lifespan. According to one or more embodiments, a use cycle of the probe card 200 may be maximized by precisely measuring the contact resistance Rcnt of the probes 231 through 236. Accordingly, the cost for manufacturing the probe card 200 may be saved.

A system for manufacturing a semiconductor device according to the related art uses an I/O pad, a power terminal, etc. to measure contact resistances of probes of a probe card. In this case, the probe, for which the contact resistance is to be measured, is electrically connected to the I/O pad, the power pad, etc., and due to process distribution of a threshold voltage of an electrostatic discharge (ESD) diode formed on a device under test, the contact resistance may not be precisely measured.

In more detail, according to the related art, the ESD diode may be turned-on by applying a current to any one of the I/O pad and the power pad, and a potential of any one of the I/O pad and the power terminal may be measured to measure the contact resistance. Here, a threshold voltage of the ESD diode may become different for each device, and may cause significant effects on a potential value of any one of the I/O pad and the power terminal. Thus, a value contributed by the threshold voltage of the ESD diode in a measured voltage may be misidentified and/or not identified. Accordingly, the precision and reliability of a test measuring a value of the contact resistance Rcnt in a device with an ESD may be low.

According to one or more embodiments, a voltage distribution circuit connected to the ground pads G1 and G2 may be used to mitigate and/or reduce the effects of the process distribution of the threshold voltage of the ESD diodes. Thus, the contact resistance Rcnt may be measured with a higher precision. Thus, the reliability of the EDS process, the reliability of a process of manufacturing a semiconductor device using the EDS process, and the reliability of the manufactured semiconductor device may be improved.

FIGS. 3A through 4B are schematic diagrams for describing systems 10a, 10b, 10c, and 10d for manufacturing a semiconductor device, according to one or more embodiments.

For convenience of explanation, only one device under test DUT and the probe card 200 corresponding thereto are illustrated. However, one of ordinary skill in the art may easily realize a system including a probe card for testing a plurality of devices under test, from descriptions given hereinafter.

For convenience of explanation, aspects that are the same as the aspects described with reference to FIG. 2 are not repeated and the different aspects are mainly described.

Figure 3A:
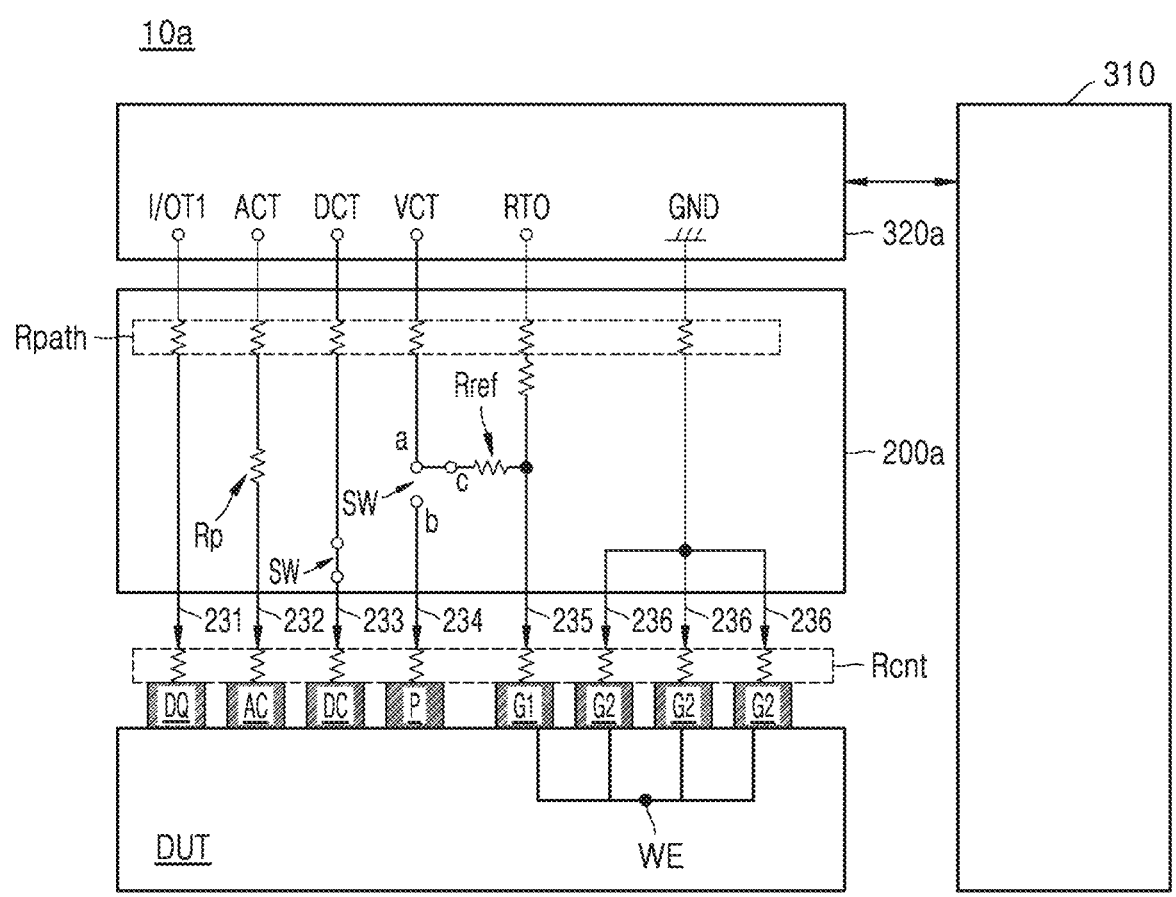

Referring to FIG. 3A, the tester head 320a included in the system 10a for manufacturing the semiconductor device of FIG. 3A may omit a resistance test input node, unlike the tester head 320 included in FIG. 2.

According to one or more embodiments, the probe card 200a may include a conversion switch device CSW. Due to an operation of the conversion switch device CSW, any one of test nodes (for example, a VCC test node VCT) may be alternatively connected to the contact resistance test probe 235 and the VCC probe 234.

According to some embodiments, the conversion switch device CSW may include, for example, a relay, but it is not limited thereto. The conversion switch device CSW may connect a node a connected to the VCC test node VCT to a node c connected to a terminal of the reference resistor Rref, in an operation of measuring the contact resistance Rcnt of the contact resistance test probe 235. After the test of the contact resistance Rcnt, the conversion switch device CSW may connect the node a, connected to the VCC test node VCT, to a node b, connected to the VCC probe 234, in an operation of an EDS test described below.

Thus, an additional node, to which an input value Vin for measuring the contact resistance Rcnt, may not be required, and thus, the usability of the nodes of the tester head 320 may be improved. A terminal of the reference resistor Rref may be connected to a switch device and the other terminal may be connected to a resistance test output node RTO.

Figure 3B:
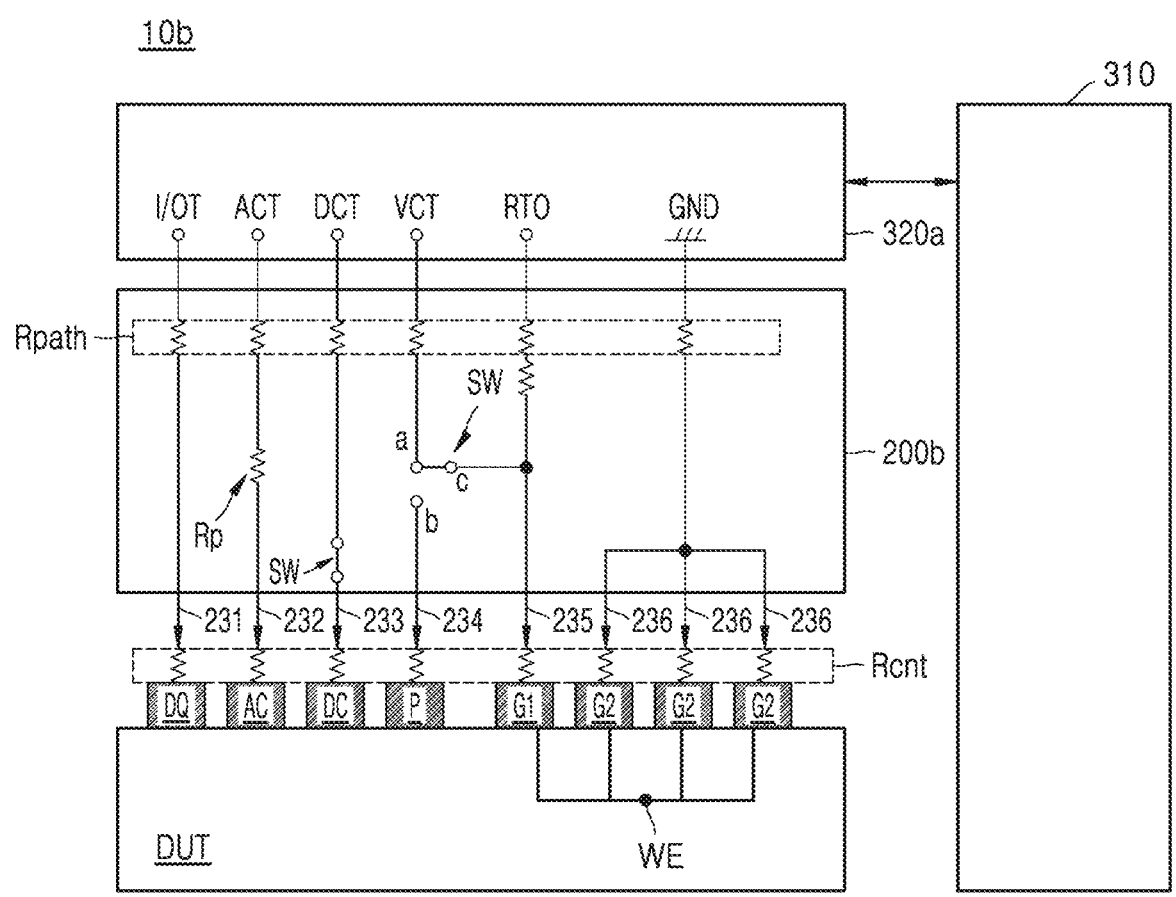

Referring to FIG. 3B, the tester head 320a of the system 10b for manufacturing the semiconductor device of FIG. 3B may be similar to the tester head 320 of FIG. 3A, but the probe card 200b may omit the reference resistor Rref. In this case, a resistance of the conversion switch device CSW may be known with high precision and may substitute the function of the reference resistor Rref (see FIG. 3A). Thus, the resistance of the reference resistor Rref of Equation 2 may be replaced by the resistance of the switch device SW.

Figure 4A:
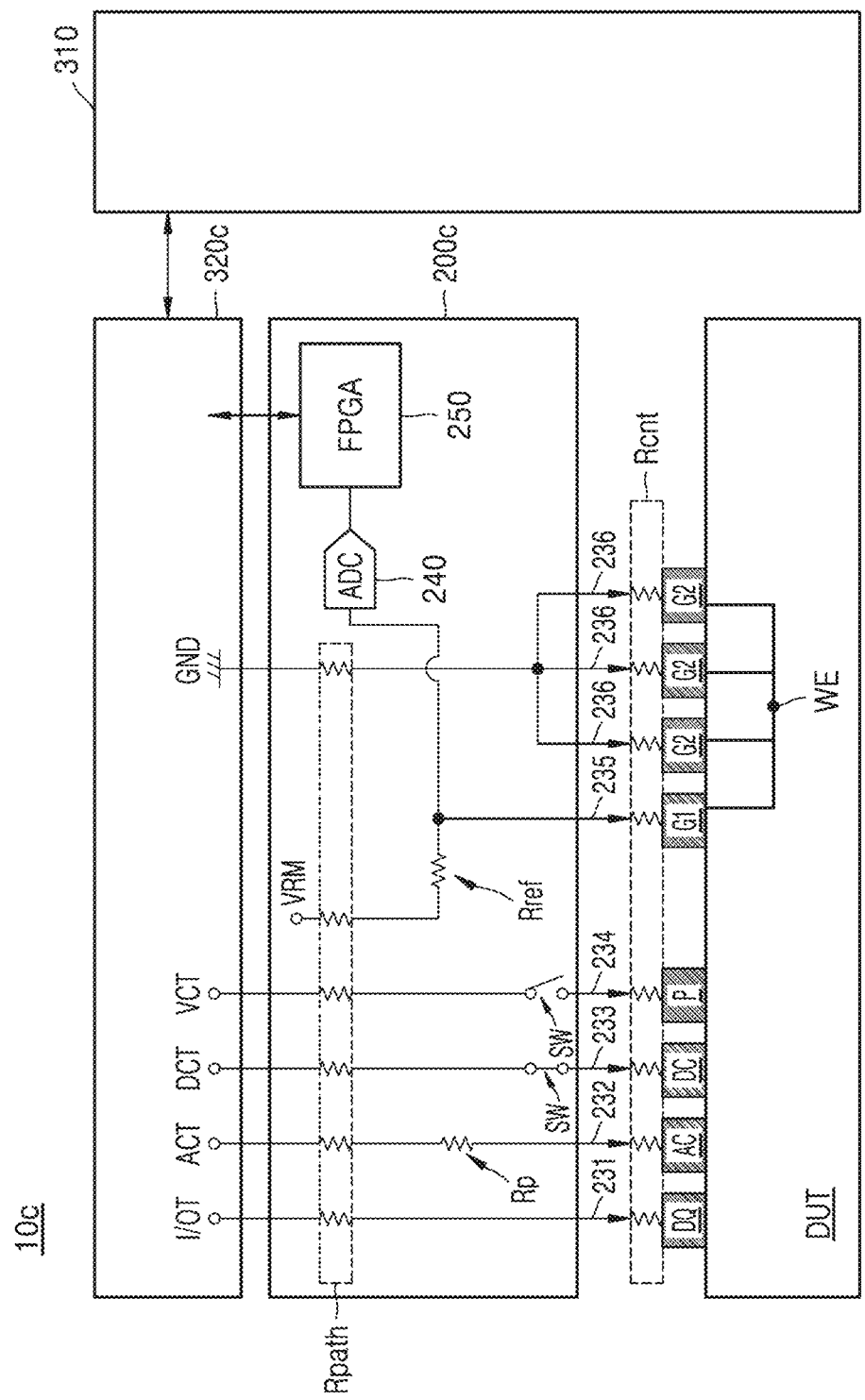

Referring to FIG. 4A, a reference test input node RTI and a reference test output node RTO may be omitted. An additional node, to which an input value Vin for measuring the contact resistance Rcnt is to be applied, and an additional node for the measurement may be used, and thus, the usability of the nodes of the tester head 320 may be improved.

In the embodiment of FIG. 4A, the probe card 200c may further include a voltage generator VRM, an analog-to-digital converter (ADC) 240, and a field programmable gate array (FPGA) 250.

The voltage generator VRM may function as a resistance test input node RTI of FIG. 2. The voltage generator VRM may generate an input potential Vin by receiving power from the outside. The voltage generator VRM may provide the input potential Vin to a terminal of the reference resistor Rref.

The ADC 240 may convert a measuring potential Vmeas of the other terminal of the reference resistor Rref into a digital signal. The FPGA 250 may read the digital signal, transmit the digital signal to the tester head 320c, and/or perform an operation based on the digital signal, and then transmit a result of the operation to the tester head 320. The operation may include, for example, an operation for calculating the contact resistance Rcnt described with reference to FIG. 2.

Figure 4B:
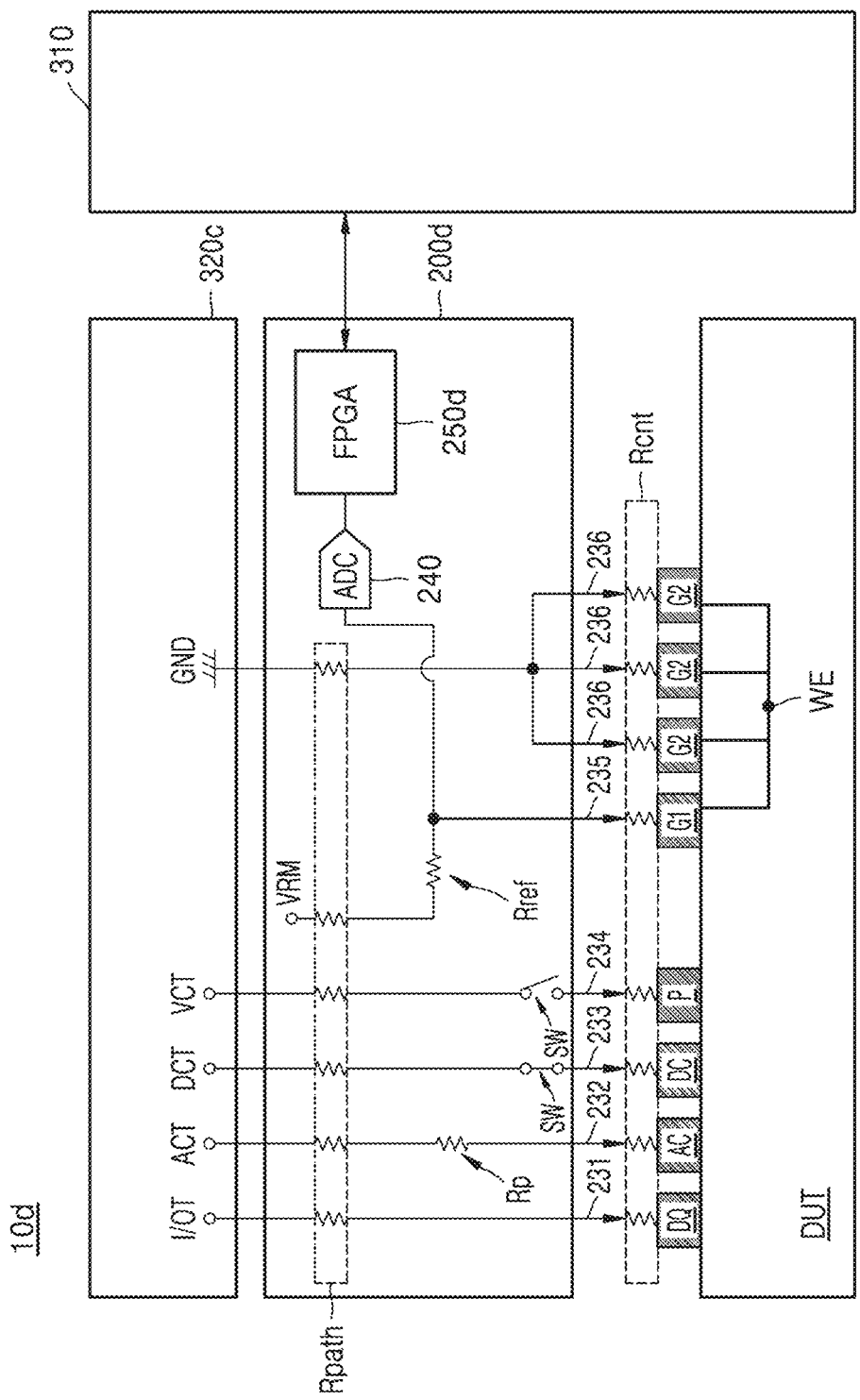

In FIG. 4B, unlike FIG. 4A, the FPGA 250d may directly exchange measurement data and operation results with the tester server 310.

Figure 5:
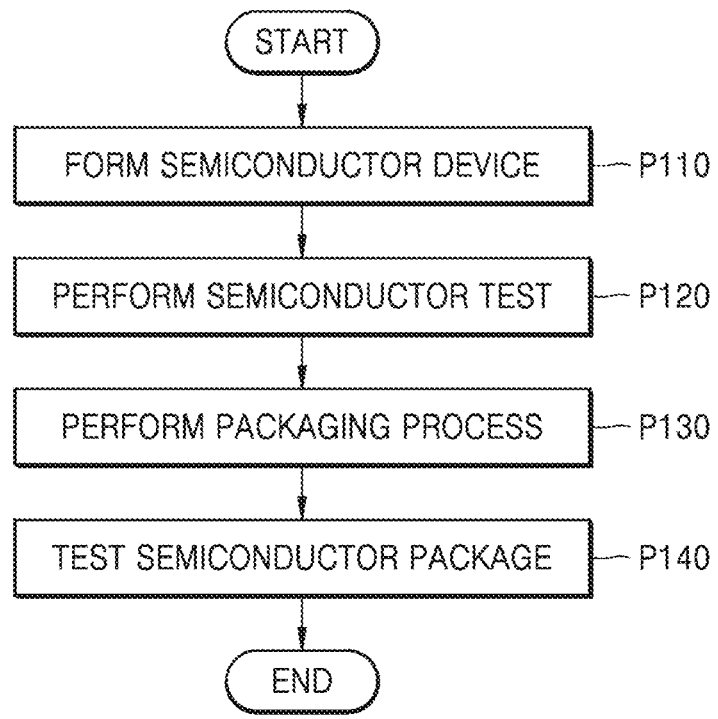
FIGS. 5 through 7 are flowcharts of a method of manufacturing a semiconductor device, according to some example embodiments.
Figure 6:
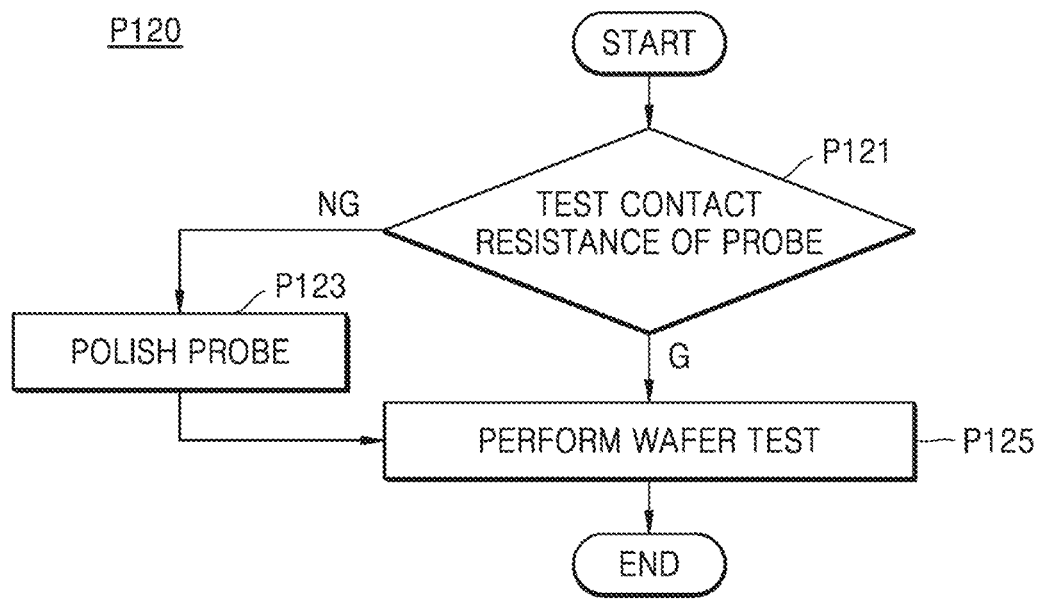
Figure 7:
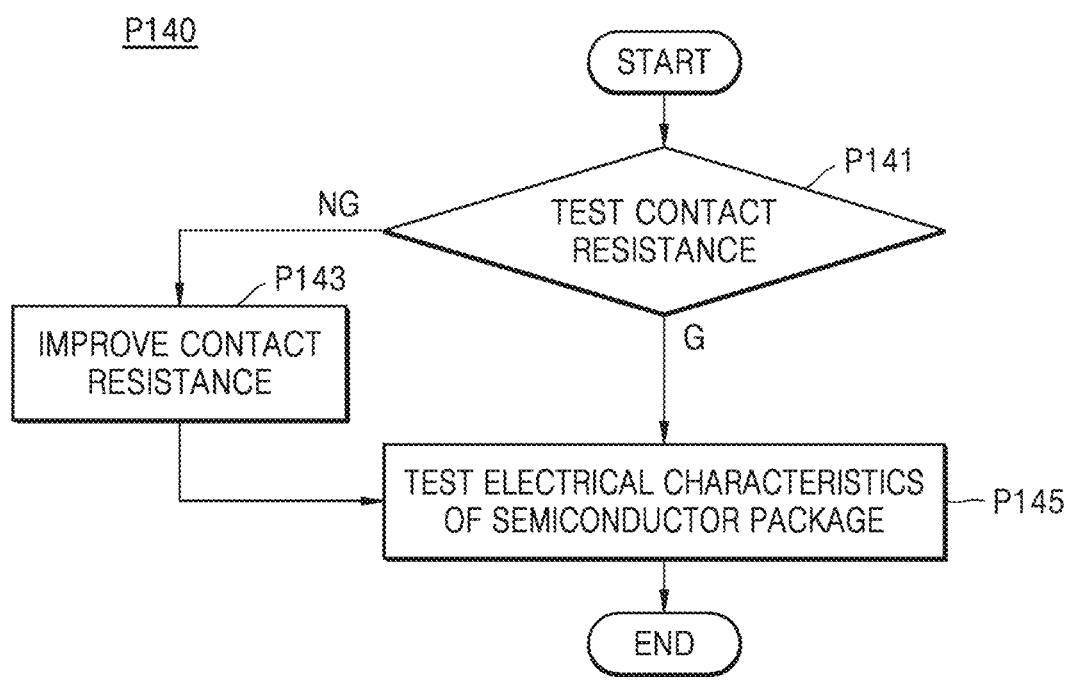

FIGS. 5 through 7 are flowcharts of a method of manufacturing a semiconductor device, according to some example embodiments. FIG. 6 is the flowchart for describing a semiconductor device test P120 of FIG. 5 and FIG. 7 is the flowchart for describing a semiconductor package test P140 of FIG. 5.

Referring to FIG. 5, in operation P110, a semiconductor device may be formed.

A process of forming the semiconductor device in operation P110 may include i) a process of manufacturing a substrate, ii) an oxidization process for forming an oxide layer, iii) a lithography process including spin coating, exposure, and development, iv) a thin-film deposition process, v) a dry or a wet etching process, and vi) a metal interconnect process.

The substrate manufacturing process may include forming a silicon ingot by, for example, crystallizing silicon or fusing polycrystalline silicon, cooling, and/or cutting the ingot to form the substrate. The substrate manufacturing process may include polishing, cleaning, and testing operations of a surface of the substrate.

The substrate, on which a semiconductor device is formed, may include, for example, silicon (Si). The substrate may include a semiconductor element, such as germanium (Ge), or a compound semiconductor, such as silicon carbide (SiC), gallium arsenide (GaAs), indium arsenide (InAs), and indium phosphide (InP).

The oxidization process may include forming a thin and uniform oxide layer on the substrate. For example, if the substrate is silicon, an oxide layer may be formed by allowing a chemical reaction between oxygen and/or moisture and the silicon substrate surface. The oxidation may be performed in a high temperature environment, for example, about 800 degrees Celsius to about 1200 degrees Celsius. The oxidization process may include dry oxidization and wet oxidization. Dry oxidization may form an oxide layer by allowing a reaction between a gas comprising oxygen and the substrate; wet oxidization may form an oxide layer by allowing reaction a between oxygen and the substrate in a moist environment.

According to one or more embodiments, a silicon-on-insulator (SOI) structure may be formed on the substrate by using the oxidization process. The substrate may include a buried oxide layer. According to one or more embodiments, the substrate may have various device isolation structures, such as shallow trench isolation (STI), and/or circuit patterns.

The lithography process may develop the circuit patterns on to the substrate by transfer of the circuit pattern onto the substrate through exposure via a lithography mask. The lithography process may be performed in a sequential order of spin coating, exposure, and development.

The thin-film deposition process may include, for example, any one of atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and DC magnetron sputtering.

The dry etching process may include, for example, any one of reactive ion etching (ME), deep RIE (DRIE), ion beam etching (IBE), and Argon milling. As another example, the dry etching process to be performed on the substrate W may include atomic layer etching (ALE). Also, the wet etching process to be performed on the substrate W may include an etch process using at least one of $Cl_2$, HCl, $CHF_3$, $CH_2F_2$, $CH_3F$, $H_2$, $BCL_3$, $SiCl_4$, Bra, HBr, $NF_3$, $CF_4$, $C_2F_6$, $C_4F_8$, $SF_6$, $O_2$, $SO_2$, and COS as an etchant gas.

The metal interconnect process may include a process of forming conductive interconnects, for example a metal interconnect, to realize a circuit pattern for operating the semiconductor device. Transmission paths for grounds, power, and signals for operating semiconductor devices may be formed by using the metal interconnect process. The metal interconnect may include a metal like platinum, silver, aluminum, tungsten, etc.

According to one or more embodiments, in the process of forming the semiconductor device, a planarization process, such as a chemical mechanical polish (CMP) process, an ion injection process, etc. may be performed.

Next, the semiconductor device may be tested in operation P120. The test of the semiconductor device may include, for example, the EDS test described above.

Referring to FIGS. 1, 2, 5, and 6, after the substrate W is arranged in the chamber 100, a probe contact resistance test may be performed on the devices under test DUT1 and DUT2 included in the substrate W, in operation P121. The probe contact resistance test is substantially the same as the probe contact resistance test described with reference to FIG. 2.

The test of the contact resistance Rcnt of the probe may include bringing the probe card 200 into contact with the substrate W including the devices under test DUT1 and DUT2. The test of the contact resistance Rcnt of the probe may include applying an input potential to one terminal of the reference resistor Rref through the resistance test input nodes RTI1 and RTI2 of the tester head 320. The test of the contact resistance Rcnt of the probe may include measuring a potential applied to the other terminal of the reference resistor Rref through the resistance test output nodes RTO1 and RTO2 of the tester head 320.

After testing the contact resistance Rcnt of the probes 231 through 236, in a case G when the contact resistance Rcnt does not exceed a threshold value, a test of the substrate W may be performed in operation P125.

In a case NG when the contact resistance Rcnt of the probes 231 through 236 exceeds the threshold value, the test of the substrate W may be performed in operation P125, after polishing the probes 231 through 236 in operation P123.

During the test of the substrate W, in order to determine electrical characteristics of the devices under test DUT1 and DUT2, the electrical characteristics may be corrected by using the contact resistance Rcnt measured in operation P121. Thus, the reliability of the semiconductor device test may be improved.

According to one or more embodiments, determination as to whether to polish the probes 231 through 236 may be dependent on at least one of a sum, an average, and/or a median value of the measured contact resistances of the probes, but it is not limited thereto.

In operation P130, a packaging process may be performed. The packaging process may include a wafer backgrinding process, a wafer sawing process, a die attaching process, a wire bonding process, a molding process, a marking process, a solder ball mounting process, and an individualization process.

Referring to FIGS. 5 and 7, after the packaging process, a package test may further be performed in operation P140. The package test may include an assembly out test, a DC test, a burn-in test, a monitoring burn-in test, a post burn-in test, and a final test.

The package test in operation P140 may be performed by a system 20 for manufacturing a semiconductor device described with reference to FIGS. 11 through 16.

The assembly out test is a process of composing a product lot card by identifying a type, the quantity, the I/O quantity (the number of bits), etc. of a semiconductor package.

The DC test is a process of identifying defects having occurred through fabrication and an assembly process.

The burn-in test is a process for removing a product in advance, which may have defects, and may include TDBB, TZDB, etc.

The monitoring burn-in test adds a monitoring function to the burn-in test. The monitoring burn-in test may reduce the period for analyzing defects, compared with the burn-in test, and may intensify the test with respect to quality defects.

The post burn-in test may be performed on a semiconductor package having passed the tests described in detail above. The post burn-in test may test electrical characteristics and functions of the semiconductor package in spaces having room temperature and a low temperature.

The semiconductor package having passed the post burn-in test may receive a final high temperature test, wherein the electrical characteristics and functions of the semiconductor device under high temperature may be tested.

Referring to FIG. 7, the test of the semiconductor package in operation P140 may include testing (P141) a contact resistance, and when the contact resistance is excellent (G) (for example, less than a threshold resistance), the semiconductor package test may include testing the described electrical characteristics of the semiconductor package in operation P145.

According to some example embodiments, the package test may be performed by inserting the semiconductor package (or a device under test) into a socket arranged on a substrate for a test, and then, testing the electrical characteristics, such as the operation characteristics.

According to some example embodiments, a semiconductor socket 1200 (see FIG. 16) may include a plurality of socket pins 1220 (see FIG. 16) for electrical connection between the semiconductor package (and/or the device under test) and external contact terminals. The socket pins may press the external contact terminals of the semiconductor package (or the device under test) to support the semiconductor package (and/or the device under test) while solidifying electrical connection between the semiconductor package (and/or the device under test) and the external contact terminals.

The contact resistance in operation S141 may refer to, for example, a contact resistance between the external contact terminals formed in the semiconductor package (or the device under test) and the plurality of socket pins, but it is not limited thereto. The contact resistance in operation S141 refers to a contact resistance with respect to a certain element forming electrical connection with the external contact terminals of the semiconductor package (or the device under test).

In the case NG when the tested contact resistance in operation P141 is not good (for example, equal to or greater than a threshold resistance), the contact resistance with respect to the semiconductor package (or the device under test) may be improved in operation P143. The improvement of the contact resistance may include the replacement of the socket 1200 (see FIG. 16), the replacement and polishing of the socket pins 1220 (see FIG. 16) in the socket 1200 (see FIG. 16), etc.

Figure 8:
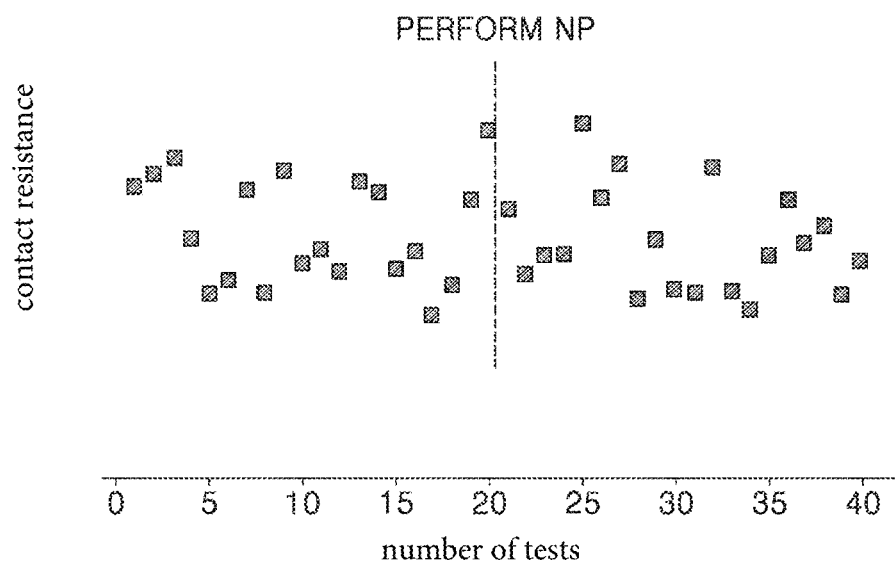
FIGS. 8 and 10 are graphs for describing an effect of an apparatus for manufacturing a semiconductor device, according to one or more embodiments.
Figure 9:
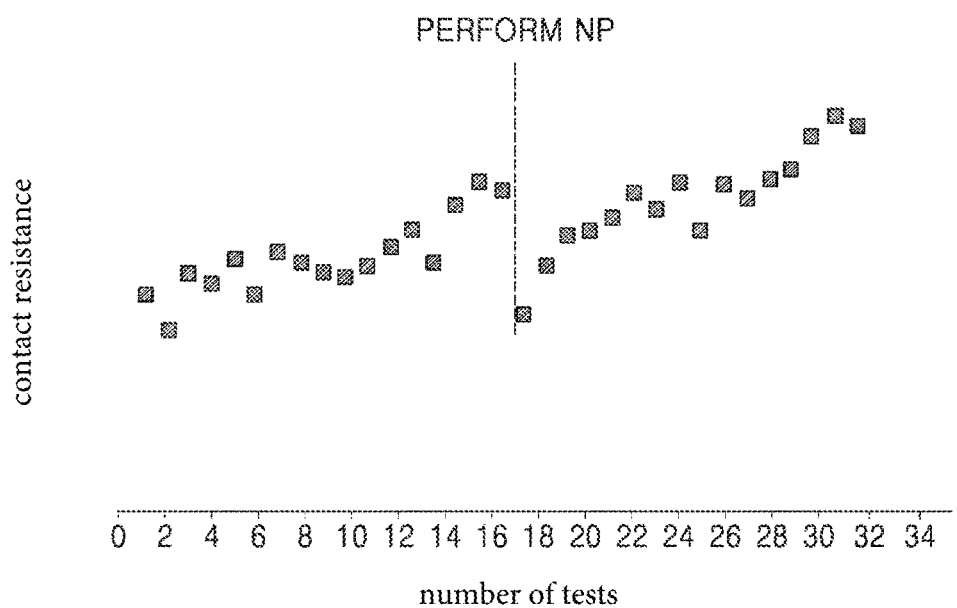
Figure 10:
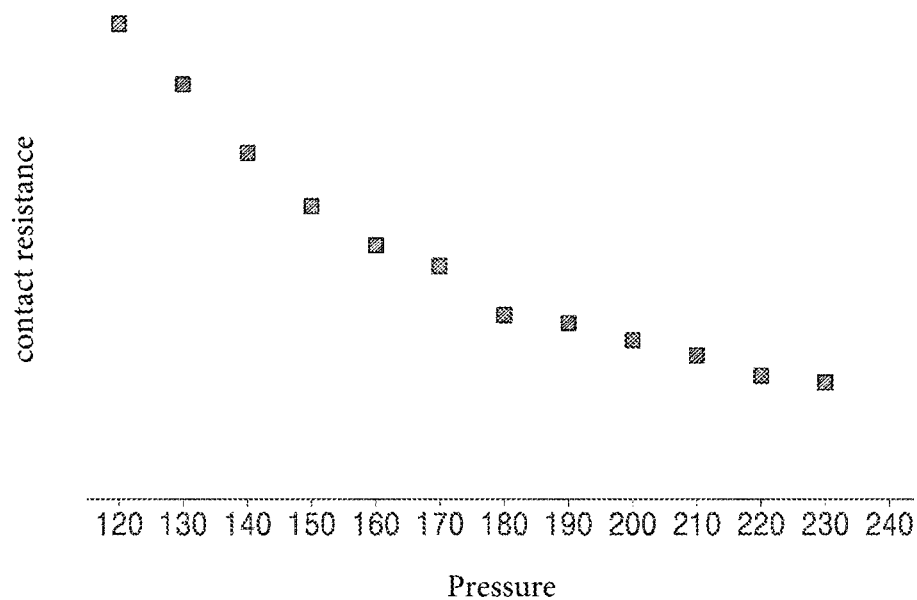

FIGS. 8 through 10 are graphs for describing an effect of a system 10 for manufacturing a semiconductor device (see FIG. 2), according to one or more embodiments.

FIG. 8 illustrates a result of a contact resistance test using a probe card according to the related art, and FIGS. 9 and 10 illustrate a result of a contact resistance test using a probe card of some example embodiments.

The horizontal axis of FIGS. 8 and 9 indicates the number of times a test using the probe card is performed and the vertical axis indicates a contact resistance (illustrated in a relative units).

The horizontal axis of FIG. 10 indicates pressure (illustrated in a random unit) by which the probe card presses a wafer, and the vertical axis indicates a contact resistance of a probe.

Referring to FIG. 8, the probe contact resistance test according to the related art does not indicate a correlation between the number of times the test using the probe card is performed and the contact resistance, due to the distribution of threshold voltage values of an ESD diode. In FIG. 8, performance of needle polishing (NP) denotes performance of a probe polishing operation and it is difficult to identify improvement of the contact resistance even after the performance of NP.

Referring to FIG. 9, the number of times the test using the probe card is performed and the contact resistance have a definite positive correlation. It is identified in FIG. 9 that the contact resistance is improved after probes are polished.

Also, referring to FIG. 10, it is identified that pressure applied to a substrate by the probe card, and the contact resistance have a definite positive correlation.

However, from the correlation between parameters (for example, the number of times the test using the probe card is performed, the pressure by which the wafer is pressed, etc.) and the content resistance illustrated in FIGS. 9 and 10, it is identified that the probe contact resistance test that is not affected by distribution of the operating voltages of the ESD diode is provided. Thus, a probe card, a system for manufacturing a semiconductor device, the system including the probe card, and a method of manufacturing the semiconductor device, the method using the system, whereby reliability is improved, may be provided.

Figure 11:
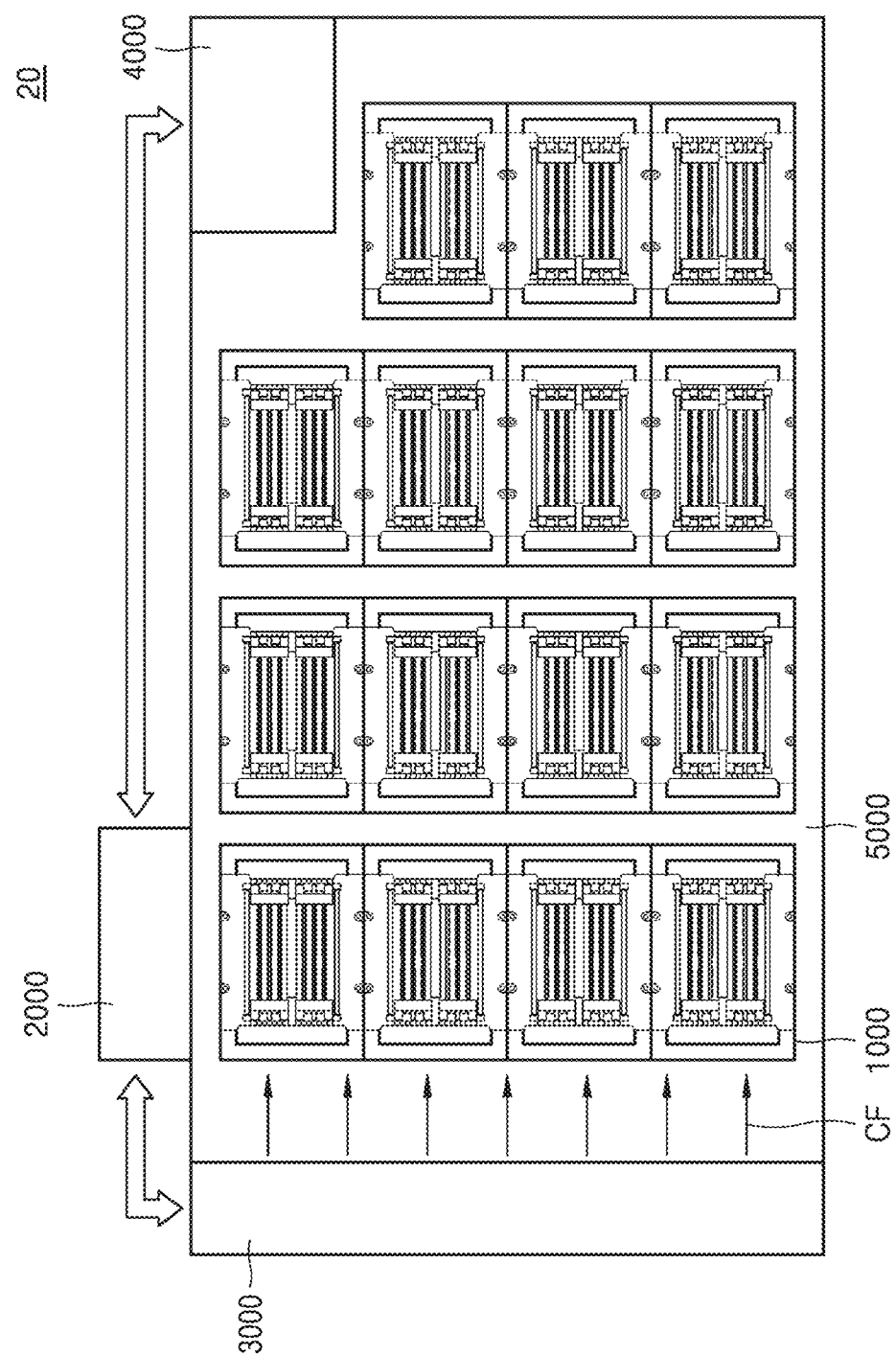
FIG. 11 is a schematic diagram for describing a system for testing a device under test, the system including a system for manufacturing a semiconductor device, according to some example embodiments.

FIG. 11 is a schematic diagram for describing the system 20 for manufacturing the semiconductor device, the system 20 including an apparatus 1000 for testing the semiconductor device, according to some example embodiments.

Referring to FIG. 11, the system 20 for manufacturing the semiconductor device may include the apparatus 1000 for testing the semiconductor device, a temperature controller 2000, a fluid supply path 3000, a control interface 4000, and a test apparatus mounting portion 5000.

Figure 14:
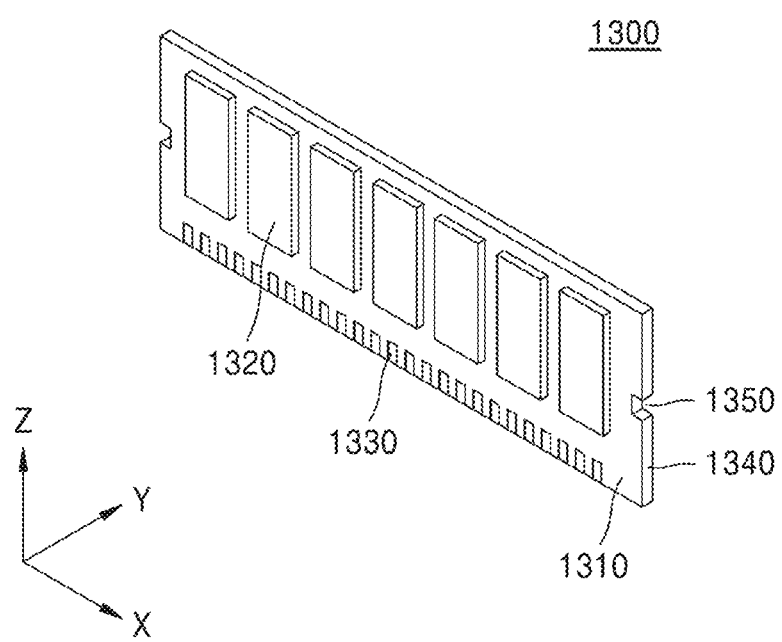
FIG. 14 is a perspective view of a device under test, which is a device under test and capable of being inserted into a socket, according to one or more embodiments.

The system 20 for manufacturing the semiconductor device may be a system for testing a device under test 1300 (see FIG. 14) including semiconductor packages 1320 (see FIG. 14). A test performed by the system 20 for manufacturing the semiconductor device may include the assembly out test, the DC test, the burn-in test, the monitoring burn-in test, the post burn-in test, and the final test described above. On a test board provided in the apparatus 1000 for testing the semiconductor device, a plurality of temperature sensors may be provided to measure, in real time, a temperature of the semiconductor packages 1320 (see FIG. 14) and/or a temperature in the apparatus 1000 for testing the semiconductor device. Alternatively, the device under test 1300 tested by the apparatus 1000 for testing the semiconductor device may include a semiconductor package, in which a temperature sensor is directly provided. For example, a semiconductor stack may include a resistance temperature detector (RTD).

The temperature controller 2000 may control the fluid supply path 3000 to heat and cool the temperature inside the apparatus 1000 for testing the semiconductor device and the temperature of the device under tests 1300 (see FIG. 14) to a pre-programmed target temperature by performing a desired (or, alternatively predetermined) temperature control program.

The temperature controller 2000 may be connected to the plurality of temperature sensors (not shown), compare temperatures measured by the plurality of temperature sensors with the target temperature, and determine whether to cool and heat an inner space of the apparatus 1000 for testing the semiconductor device and the semiconductor packages 1320 (see FIG. 14). Next, by driving the fluid supply path 3000, the temperature controller 2000 may supply a cooling or heating fluid FL to the apparatus 1000 for testing the semiconductor device. The temperature controller 2000 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc."

The control interface 4000 may include a personal computer or a central computer. The control interface 4000 may provide, to devices under test, a test command for testing the operating performance of the devices according to a temperature. The control interface 4000 may input a test recipe to the temperature controller 2000 and update and correct the test recipe. Alternatively, the control interface 4000 may provide a separate command according to a test situation to the temperature controller 2000 based on the temperatures measured by the temperature sensors. Through illustrated separately, the temperature controller 2000 and the control interface 4000 may be integrated as a single controller, For example, the temperature controller 2000 may comprise processing circuitry such hardware including logic circuits; a hardware/software combination such as a processor executing software; or a combination thereof in a personal computer or central computer included in the control interface 4000.

The test apparatus mounting portion 5000 may be configured to support and connect each component of the system 20 for manufacturing the semiconductor device. The apparatuses 1000 for manufacturing semiconductor devices may be mounted in the test apparatus mounting portion 5000. The test apparatus mounting portion 5000 may cover side portions and a lower portion of the system 20 for manufacturing the semiconductor device such that the mounted apparatus 1000 for testing the semiconductor device is not exposed to external impurities or shocks. The test apparatus mounting portion 5000 may include a plurality of central processing unit (CPU) boards configured to control the separate apparatus 1000 for testing the semiconductor device.

Figure 12:
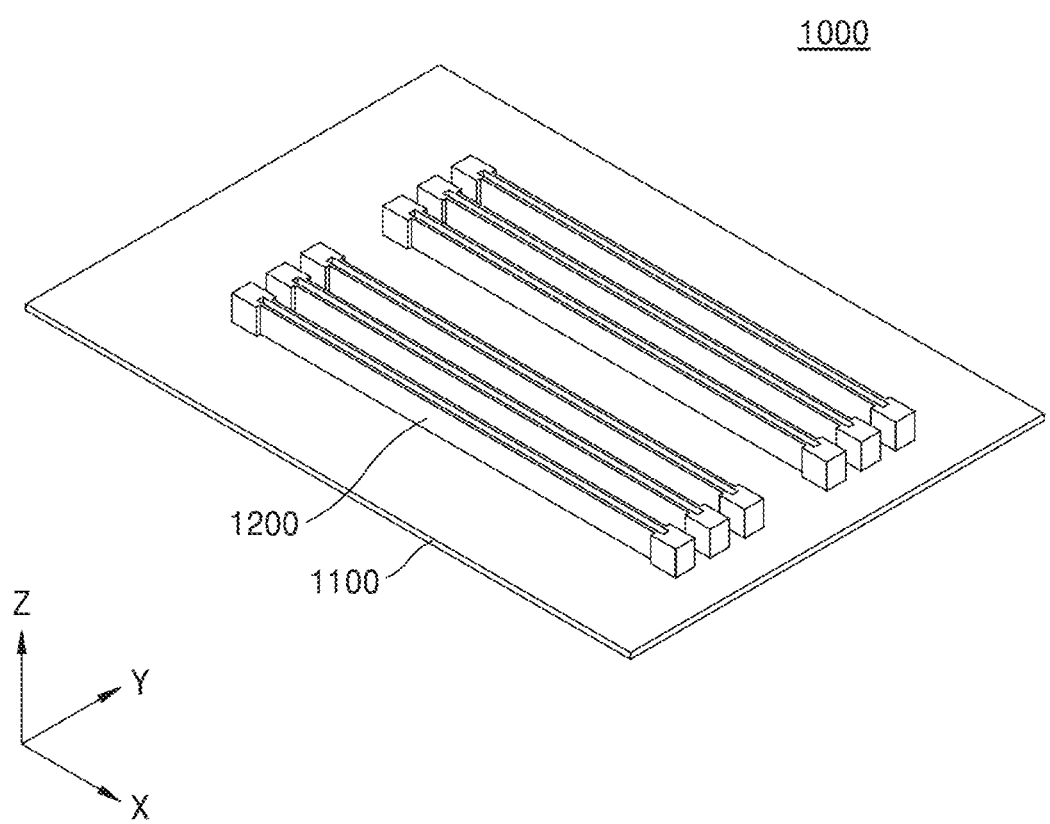
FIG. 12 is a perspective view of a system for manufacturing a semiconductor device, according to some example embodiments.
Figure 13:
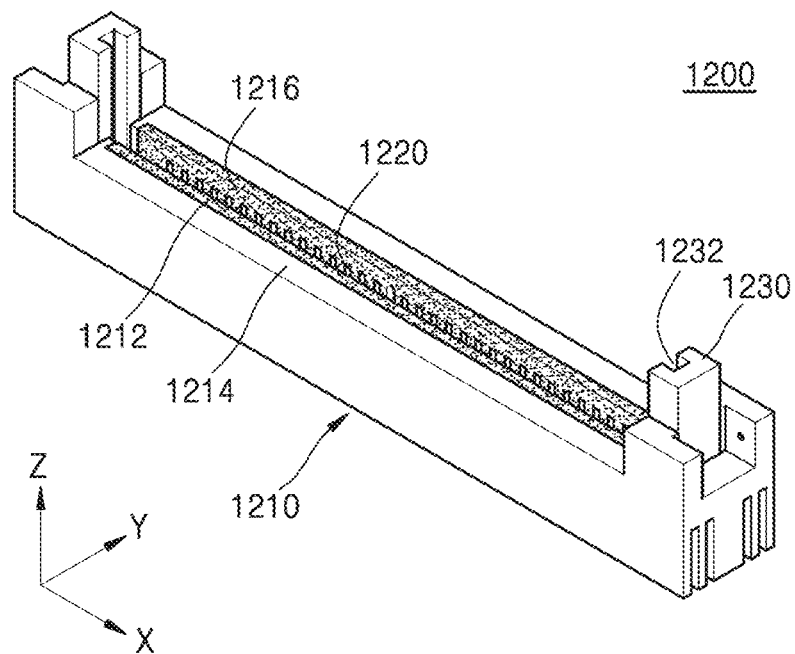
FIG. 13 is a perspective view of a socket included in the system for manufacturing the semiconductor device of FIG. 12.

FIG. 12 is a perspective view of the apparatus 1000 for testing the semiconductor device, according to some example embodiments. FIG. 13 is a perspective view of a socket 1200 included in a system for manufacturing a semiconductor device in FIG. 12.

Referring to FIGS. 12 and 13, the apparatus 1000 for testing the semiconductor device may include a test board 1100 and the sockets 1200. The apparatus 1000 for testing the semiconductor device may further include a top plate arranged on the test board 1100 and protecting the test board 1100 from external shocks and foreign materials.

In FIGS. 12 through 14, two directions on an upper surface of the test board 1100, the two directions being parallel with an upper surface of a substrate and are orthogonal to each other, are defined as an X direction and a Y direction, and a direction substantially perpendicular to the upper surface of the substrate is defined as a Z direction.

Also, when describing components before the components are coupled to the test board 1100, the defined directions are used likewise by taking into account the components after the components are coupled with the test board 1100.

The plurality of sockets 1200 may be arranged in the Y direction of the test board 1100 to be apart from each other by a certain distance. Basic circuits and components of the apparatus 1000 for testing the semiconductor device are mounted on the test board 1100. The test board 1100 may completely support the apparatus 1000 for testing the semiconductor device and may allow a stable operation of the apparatus 1000 for testing the semiconductor device to be performed.

The device under test 1300 (see FIG. 14) may be inserted into the plurality of sockets 1200. The plurality of socket pins 1220 corresponding to external contact terminals 1330 (see FIG. 14) of the device under test 1300 (see FIG. 14) inserted into the plurality of sockets 1200 may be formed in the plurality of sockets 1200.

FIG. 13 is a perspective view of the socket 1200 according to one or more embodiments.

Referring to FIG. 13, the socket 1200 may include a socket frame 1210, the plurality of socket pins 1220, and a module coupler 1230.

The socket frame 1210 may have a shape of a long bar in the X direction which is a longitudinal direction and may include an internal body 1212 and an external body 1214. One internal body 1212 may be formed at each of both sides to face each other in the Y direction that is perpendicular to the longitudinal direction of the socket frame 1210 and may include an insulating material.

A slot 1216 extending in the X direction may be formed at the center of both side surfaces of the internal body 1212. A lower end of a printed circuit board 1310 (see FIG. 14) of the device under test 1300 (see FIG. 14) may be inserted into the slot 1216. The plurality of socket pins 1220 configured to contact the plurality of external contact terminals 1330 (see FIG. 14), respectively, may be arranged at both side surfaces of the slot 1216. The plurality of socket pins 1220 may be arranged in the X direction, which is the longitudinal direction of the socket frame 1210. The plurality of socket pins 1220 may be coupled to and supported by the internal body 1212. When the sockets 1200 are mounted on the test board 1100 (see FIG. 12), the plurality of socket pins 1220 may be electrically connected to circuits mounted on the test board 1100 (see FIG. 12).

The external body 1214 may cover an outer portion of the internal body 1212. The module coupler 1230 configured to fix the device under test 1300 (see FIG. 12) may be arranged at both ends of the external body 1214 in the X direction.

FIG. 14 is a perspective view of the device under test 1300, which is a device under test and capable of being inserted into the socket 1200, according to one or more embodiments.

Referring to FIG. 14, the device under test 1300 may include the printed circuit board 1310, semiconductor packages 1320, and the external contact terminals 1330.

According to one or more embodiments, the device under test 1300 may include a memory module. For example, the device under test 1300 may include a dual inline memory module (DIMM), a small outline DIMM (SO-DIMM), an unbuffered-DIMM, or a fully buffered DIMM (FB-DIMM). However, it is not limited thereto.

The printed circuit board 1310 may have a shape of a rectangular plate. A socket binder 1340 coupled to the socket 1200 (see FIG. 13) may be formed at both ends of the printed circuit board 1310 in the X direction. A hook insertion groove 1350 configured to more stably couple the socket binder 1340 and the socket 1200 (see FIG. 13) may be formed at a center portion of the socket binder 1340.

The printed circuit board 1310 may be a substrate for mounting the plurality of semiconductor packages 1320. The printed circuit board 1310 may include a printed circuit board (PCB) card, a plastic substrate, or semiconductor substrates having other structures. The printed circuit board 1310 may have a structure in which a plurality of metal interconnect layers and a plurality of insulating layers are alternately stacked.

The semiconductor packages 1320 may include non-volatile memory devices. For example, the semiconductor packages 1320 may include NAND-type flash memories. As another example, the semiconductor packages 1320 may include PRAM, MRAM, ReRAM, FRAM, NOR flash memory, etc. Also, the semiconductor packages 1320 may include volatile memory devices, such as DRAM and SRAM.

According to cases, the device under test 1300 may further include a register. The register may be a high speed exclusive area that momentarily memorizes a very small quantity of data or an intermediate result in process. The register may include an accumulator, an arithmetic register, an instruction register, a shift register, an index register, etc.

The plurality of external contact terminals 1330 may be serially arranged below the printed circuit board 1310 in a longitudinal direction (that is, the X direction) of the printed circuit board 1310. The external contact terminals 1330 may include a ground terminal, a power terminal, and a signal terminal. The signal terminal may include an address terminal, to which an address signal is input, a command terminal, to which a command signal is input, a clock terminal, to which a clock signal is input, and a data terminal, to which data is input or from which data is output. According to some example embodiments, the external contact terminals 1330 may include any one of pads, pins, and tabs.

Figure 15:
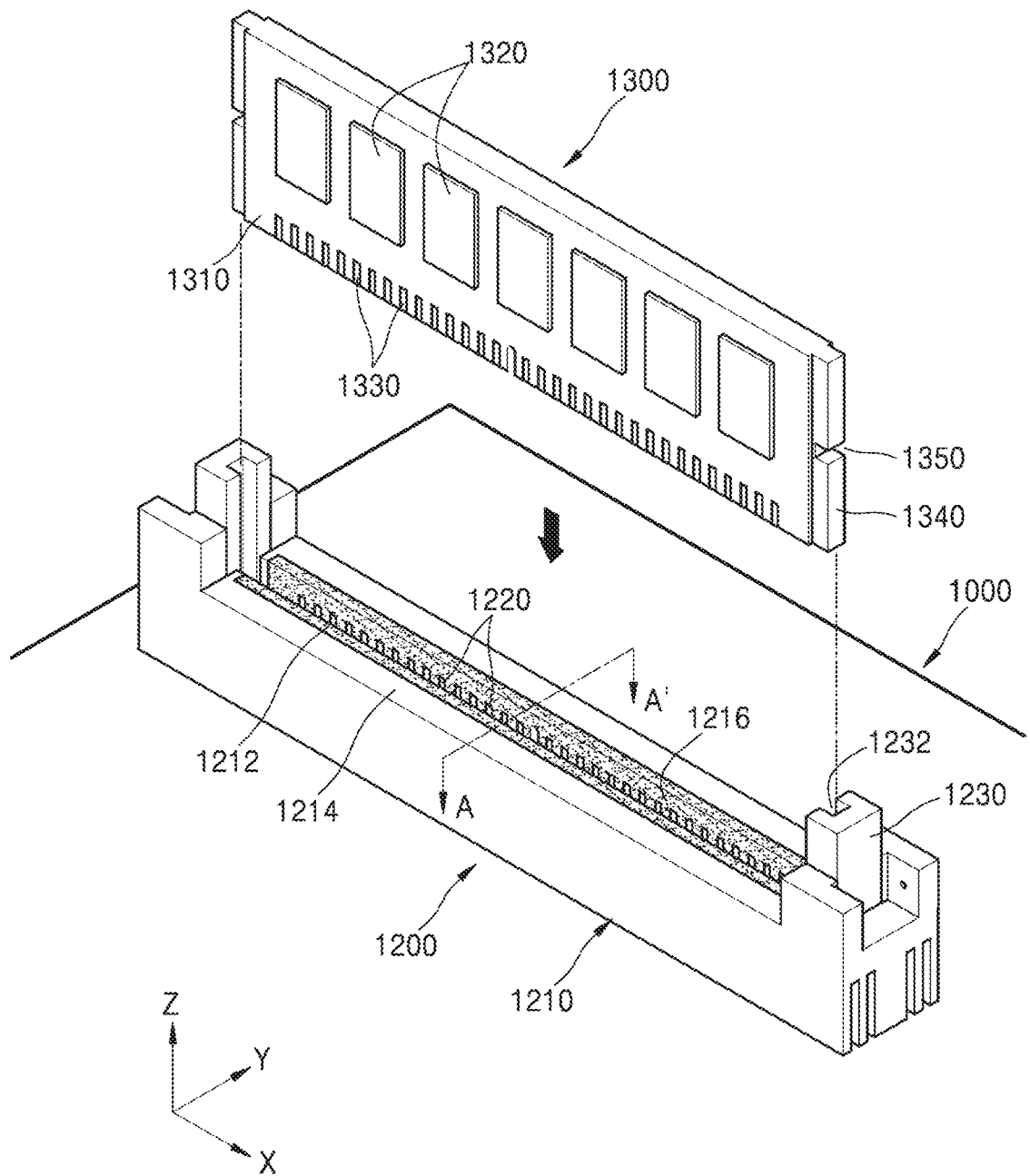
FIG. 15 is a perspective view for describing insertion of the device under test of FIG. 14 into the socket of FIG. 13.

FIG. 15 is a perspective view for describing insertion of the device under test 1300 of FIG. 14 into the socket 1200 of FIG. 13.

Figure 16:
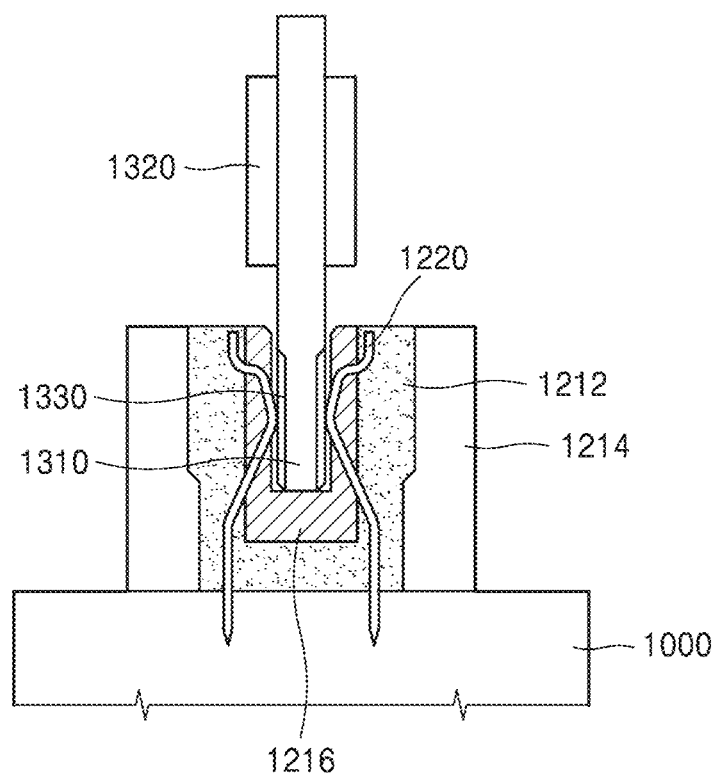
FIG. 16 is a cross-sectional view taken along line A-A' of FIG. 15.

FIG. 16 is a cross-sectional view taken along line A-A' of FIG. 15. FIG. 15 illustrates the socket 1200 and the device under test 1300 after the socket 1200 and the device under test 1300 are coupled to each other.

Figure 17:
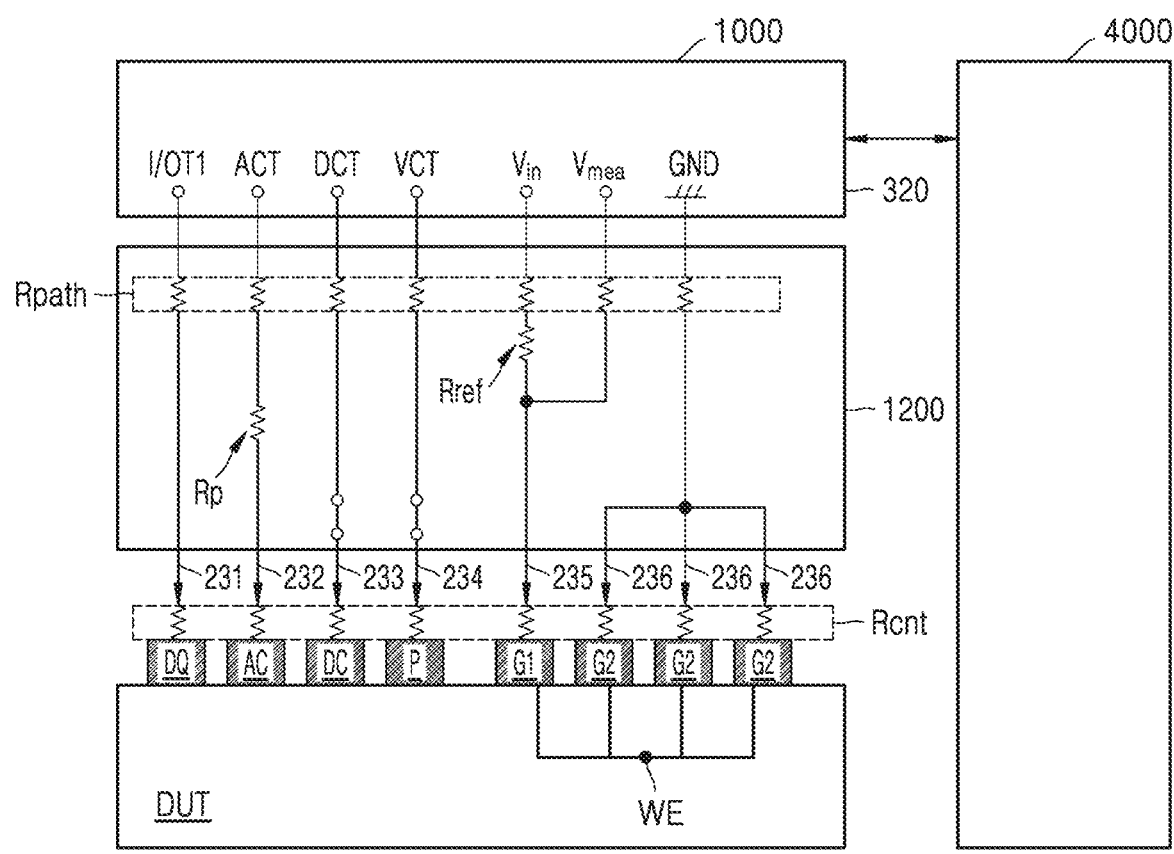
FIG. 17 is a schematic diagram for describing a test of a device under test, according to some example embodiments.

Referring to FIGS. 15 through 17, the plurality of sockets 1200 may be formed to be supported by the test board 1100, and the device under test 1300 may be supported by being coupled to the plurality of sockets 1200. In detail, a lower end of the printed circuit board 1310 of the device under test 1300 may be inserted into the slot 1216 formed in the socket frame 1210 of the plurality of sockets 1200. Accordingly, the external contact terminals 1330 arranged at the lower end of the printed circuit board 1310 and the plurality of socket pins 1220 arranged at both sides of the slot 1216 may be physically and/or electrically connected with each other.

When the device under test 1300 is inserted into the plurality of sockets 1200, due to friction between the socket pins 1220 and the external contact terminals 1330, wreckage of the external contact terminals 1330 is remains in the socket pins 1220 to increase a contact resistance of the socket pins 1220.

FIG. 17 is a schematic view for describing a test of the device under test 1300, according to some example embodiments.

FIG. 17 is a schematic diagram of a circuit structure of the device under test 1300 corresponding to one semiconductor package 1320, the socket 1200, the test board 1100, and the control interface 4000, after the device under test 1300 corresponding to one semiconductor package 1320, the socket 1200, the test board 1100, and the control interface 4000 are coupled. Referring to FIG. 17, a voltage distribution circuit that is similar as the voltage distribution circuit of FIG. 2 may be formed.

The external contact terminals 1330 may include a data pad DQ, a power pad P, a first ground pad G1, and second ground pads G2.

The test board 1100 may include an I/O test node I/OT, a VCC test node VCCT, a resistance test input node RTI, and a resistance test output node RTO. The I/O test node I/OT, the VCC test node VCCT, the resistance test input node RTI, and the resistance test output node RTO are substantially the same as the I/O test node I/OT, the VCC test node VCCT, the resistance test input node RTI, and the resistance test output node RTO described with reference to FIG. 2.

The socket 1200 may include a reference resistor Rref. A first terminal of the reference resistor Rref may be connected to any one of the socket pins 1220 connected to the ground pad G1. The first terminal of the reference resistor Rref may further be connected to the resistance test output node RTO. A second terminal of the reference resistor Rref may be connected to the resistance test input node RTI of the test board 1100.

Thus, as described above with reference to FIG. 2, the contact resistance of the socket pins 1220 contacting the first ground pad G1 may be measured with high precision.

While the inventive concepts have been particularly shown and described with reference to embodiments thereof, it will be understood that various changes in form and details may be made therein without departing from the spirit and scope of the following claims.

What is claimed is:

1. A probe card comprising:
   a reference resistor comprising a first terminal and a second terminal, the second terminal configured to receive an input potential;
   a first probe connected to the first terminal of the reference resistor, the first probe configured to contact a first ground pad of a device under test;
   a ground node configured to apply a reference potential; and
   a second probe connected to the ground node, the second probe configured to contact a second ground pad of the device under test, and to apply the reference potential to the second ground pad such that an electrical short forms between the first ground pad and the second ground pads.

2. The probe card of claim 1, wherein the reference resistor has a resistance of about 10Ω to about 50Ω.

3. The probe card of claim 1, wherein an absolute value of a difference between the input potential and the reference potential is equal to or less than 5V.

4. The probe card of claim 1, wherein the input potential is determined based on a power capacity and a potential capacity of the reference resistor.

5. The probe card of claim 1, wherein the electrical short forms in a well of the device under test.

6. The probe card of claim 1, further comprising:
   a third probe configured to contact an alternating current (AC) pad of the device under test; and
   a protection resistor connected to the third probe,
   wherein the protection resistor has a greater resistance than a resistance of the reference resistor.

7. The probe card of claim 6, wherein the protection resistor has a resistance of about 100Ω to about 300Ω.

8. The probe card of claim 1, further comprising:
   a fourth probe configured to contact a power pad of the device under test, and
   wherein the input potential is equal to or less than a maximum operating potential to be applied to the power pad through the fourth probe.

9. The probe card of claim 1, further comprising:
   a voltage generator configured to generate the input potential.

10. The probe card of claim 1, further comprising:
    an analog-to-digital converter (ADC) configured to generate a digital signal based on a voltage applied to the first terminal of the reference resistor; and
    a field programmable gate array (FPGA) configured to read the digital signal and transmit the read digital signal to outside of the probe card.

11. A system for manufacturing a semiconductor device, the system comprising:
    a probe card including
    a first probe configured to receive an input potential and contact a first ground pad of a device under test,
    a second probe configured to contact a second ground pad of the device under test and to apply a reference potential to the second ground pad such that an electrical short forms between the first ground pad and the second ground pads,
    a third probe configured to contact a power pad, to which operating power of the device under test is supplied,
    a fourth probe configured contact an alternating current (AC) pad configured to perform an AC test on the device under test,
    a fifth probe configured to contact a data pad of the device under test,
    and a sixth probe configured to contact a direct current (DC) pad and measure a potential level of a set location of the device under test;
    a tester head including a ground node, the ground node configured to provide a reference potential, the reference potential being different from the input potential, and the ground node connected to the second probe; and
    a tester server configured to generate a test signal and transmit the test signal to the tester head.

12. The system of claim 11, further comprising:
    a conversion switch device including a first terminal, a second terminal, and a third terminal, wherein the first terminal of the conversion switch device is connected to the first probe, the second terminal of the conversion switch device is connected to one of the third through sixth probes, and
    the conversion switch device is configured to selectively connect the third terminal to either one of the first terminal and the second terminal.

13. The system of claim 12 further comprising:
    a reference resistor connected between the first probe and the conversion switch device, wherein the reference resistor has a resistance of about 10Ω to about 50Ω, and
    a first terminal of the reference resistor is connected to the conversion switch device and a second terminal of the reference resistor is connected to the first probe.

14. The system of claim 12, wherein the first terminal of the conversion switch device is directly connected to the first probe.

15. A system for manufacturing a semiconductor device, the system comprising:
    a probe card including,
    a first probe configured to contact a first ground pad of a device under test,
    a reference resistor including a first terminal and a second terminal opposite to the first terminal, the reference resistor connected to the first probe by the first terminal of the reference resistor, the second terminal configured to receive an input potential, and
    a second probe configured receive a reference potential, the reference potential being different from the input potential, and the second probe configured to contact a second ground pad of the device under test such that the reference potential forms an electrical short between the first ground pad and the second ground pads;
    a tester head configured to control the probe card; and
    a tester server configured to transmit a test signal to the tester head.

16. The system of claim 15, wherein the tester head comprises:
    a resistance test input node configured to provide the input potential, and
    a ground node configured to provide the reference potential to the second probe.

17. The system of claim 15, wherein the tester head comprises:
    a resistance test output node, the tester head configured to read a potential of the first terminal of the reference resistor through the resistance test output node.

18. The system of claim 15, wherein the probe card further comprises:
    a voltage generator configured to generate the input potential;
    an analog-to-digital converter (ADC) configured to generate a digital signal based on a potential of the first terminal of the reference resistor; and a field programmable gate array (FPGA) configured to read the digital signal.

19. The system of claim 18, wherein the FPGA is further configured to transmit the digital signal to the tester head.

20. The system of claim 18, wherein the FPGA is further configured to transmit the digital signal to the tester server.

* * * * *